(12) United States Patent
Govorkov et al.

(10) Patent No.: US 7,184,204 B2
(45) Date of Patent: Feb. 27, 2007

(54) MASTER-OSCILLATOR POWER-AMPLIFIER (MOPA) EXCIMER OR MOLECULAR FLUORINE LASER SYSTEM WITH LONG OPTICS LIFETIME

(75) Inventors: Sergei V. Govorkov, Boca Raton, FL (US); Gongxue Hua, Coral Springs, FL (US); Timur Misuryaev, Coral Springs, FL (US); Alexander O. Wiessner, Goettingen (DE); Thomas Schmidt, Goettingen (DE); Rainer Paetzel, Dransfeld (DE)

(73) Assignee: Lambda Physik AG, Goettigen (DE)

( * ) Notice: Subject to any disclaimer, the term of this patent is extended or adjusted under 35 U.S.C. 154(b) by 407 days.

(21) Appl. No.: 10/881,103

(22) Filed: Jun. 30, 2004

(65) Prior Publication Data

US 2005/0002425 A1 Jan. 6, 2005

Related U.S. Application Data

(60) Provisional application No. 60/484,929, filed on Jul. 3, 2003, provisional application No. 60/484,046, filed on Jul. 1, 2003.

(51) Int. Cl.
*H01S 3/00* (2006.01)
*H01S 3/22* (2006.01)
(52) U.S. Cl. .......................... 359/333; 372/25; 372/55
(58) Field of Classification Search ................ 359/333; 372/25, 30, 55, 57
See application file for complete search history.

(56) References Cited

U.S. PATENT DOCUMENTS

| | | | |
|---|---|---|---|
| 5,689,363 A * | 11/1997 | Dane et al. ................. | 359/334 |
| 6,370,174 B1 | 4/2002 | Onkels et al. ........... | 372/38.04 |
| 6,381,257 B1 | 4/2002 | Ershov et al. ................. | 372/57 |
| 6,389,045 B1 | 5/2002 | Mann et al. .................. | 372/25 |
| 6,466,599 B1 | 10/2002 | Bragin et al. ................. | 372/58 |
| 6,693,939 B2 | 2/2004 | Klene et al. .................. | 372/58 |
| 6,721,344 B2 | 4/2004 | Nakao et al. ................. | 372/55 |
| 6,741,627 B2 | 5/2004 | Kitatochi et al. ............. | 372/57 |
| 6,904,073 B2 * | 6/2005 | Yager et al. .................. | 372/57 |
| 2002/0154668 A1 | 10/2002 | Knowles et al. .............. | 372/55 |
| 2002/0191654 A1 | 12/2002 | Klene et al. .................. | 372/25 |
| 2003/0043876 A1 | 3/2003 | Lublin et al. ................. | 372/55 |
| 2003/0219056 A1 | 11/2003 | Yager et al. .................. | 372/57 |
| 2004/0022291 A1 | 2/2004 | Das et al. ..................... | 372/55 |

FOREIGN PATENT DOCUMENTS

WO    WO 03/096497 A1    11/2003

\* cited by examiner

*Primary Examiner*—Mark Hellner
(74) *Attorney, Agent, or Firm*—Stallman & Pollock LLP

(57) ABSTRACT

The lifetime of optical components used in deep-UV (DUV) excimer laser systems, including systems in a MOPA configuration, can be increased by reducing the intensity of pulses incident upon these components. In one approach, an output pulse can be "stretched" in order to reduce the peak power of the pulse. A pulse stretching component can be used, which can be mounted outside the laser enclosure with a horizontal beam path in order to provide a delay line with a minimum impact on the laser system footprint. The horizontal beam path also can minimize the number of optical components in the arm containing the high power beam. A beamsplitting prism can be used with the delay line to avoid the rapid degradation of coatings otherwise exposed to intense UV beams. The prism can expand the beam in the delay line in order to minimize beam intensity and losses due to reflection.

52 Claims, 14 Drawing Sheets

MASTER-OSCILLATOR POWER-AMPLIFIER (MOPA) EXCIMER OR MOLECULAR FLUORINE LASER SYSTEM WITH LONG OPTICS LIFETIME

CLAIM OF PRIORITY

This application claims priority to U.S. Provisional Application No. 60/484,046, filed Jul. 1, 2003, as well as U.S. Provisional Application No. 60/484,929, filed Jul. 3, 2003, each of which is hereby incorporated herein by reference.

TECHNICAL FIELD OF THE INVENTION

The present invention relates to a Master-Oscillator Power-Amplifier (MOPA) excimer or molecular fluorine laser system, particularly a MOPA system having optics with a relatively long lifetime.

BACKGROUND

Semiconductor manufacturers are currently using deep ultraviolet (DUV) lithography tools based on KrF-excimer laser systems, operating at wavelengths around 248 nm, as well as ArF-excimer laser systems, which operate at around 193 nm. Vacuum UV (VUV) tools are based on $F_2$-laser systems operating at around 157 nm. These relatively short wavelengths are advantageous for photolithography applications because the critical dimension, which represents the smallest resolvable feature size that can be produced photolithographically, is proportional to the wavelength used to produce that feature. The use of smaller wavelengths can provide for the manufacture of smaller and faster microprocessors, as well as larger capacity DRAMs, in a smaller package. In addition to having smaller wavelengths, such lasers have a relatively high photon energy (i.e., 7.9 eV) which is readily absorbed by high band gap materials such as quartz, synthetic quartz ($SiO_2$), Teflon (PTFE), and silicone, among others. This absorption leads to excimer and molecular fluorine lasers having even greater potential in a wide variety of materials processing applications. Excimer and molecular fluorine lasers having higher energy, stability, and efficiency are being developed as lithographic exposure tools for producing very small structures as chip manufacturing proceeds into the 0.18 micron regime and beyond. The desire for such submicron features comes with a price, however, as there is a need for improved processing equipment capable of consistently and reliably generating such features. Further, as excimer laser systems are the next generation to be used for micro-lithography applications, the demand of semiconductor manufacturers for powers of 40 W or more to support throughput requirements leads to further complexity and expense.

In laser systems used for photolithography applications, for example, it would be desirable to move toward higher repetition rates, increased energy stability and dose control, increased system uptime, narrower output emission bandwidths, improved wavelength and bandwidth accuracy, and improved compatibility with stepper/scanner imaging systems. It also would be desirable to provide lithography light sources that deliver high spectral purity and extreme power, but that also deliver a low cost chip production. Requirements of semiconductor manufacturers for higher power and tighter bandwidth can place excessive, and often competing, demands on current single-chamber-based light sources. Many of these obstacles are overcome by taking advantage of a dual-gas-discharge-chamber technology referred to herein as MOPA (Master Oscillator—Power Amplifier) technology. MOPA technology can be used to separate the bandwidth and power generators of a laser system, as well as to control each gas discharge chamber separately, such that both the required bandwidth and pulse energy parameters can be optimized. Using a master oscillator (MO), for example, an extremely tight spectrum can be generated for high-numerical-aperture lenses at low pulse energy. A power amplifier (PA), for example, can be used to intensify the light, in order to deliver the power levels necessary for the high throughput desired by the chip manufacturers. The MOPA concept can be used with any appropriate laser, such as KrF, ArF, and $F_2$-based lasers.

Components of a MOPA laser system can include those discussed in U.S. patent application Ser. No. 09/923,770, filed Aug. 6, 2001, hereby incorporated herein by reference, which discloses a molecular fluorine ($F_2$) laser system including a seed oscillator (or master oscillator) and power amplifier. The seed oscillator comprises a laser tube including multiple electrodes therein, which are connected to a discharge circuit. Seed radiation can alternatively be provided by an excimer lamp maintained at low pressure. The laser tube is part of an optical resonator for generating a laser beam including a first line of multiple characteristic emission lines around 157 nm. The laser tube can be filled with a gas mixture including molecular fluorine and a buffer gas. The gas mixture can be at a pressure below that which results in the generation of a laser emission, including the first line around 157 nm having a natural line width of less than 0.5 pm, without an additional line-narrowing optical component for narrowing the first line. The power amplifier increases the power of the beam emitted by the seed oscillator to a desired power for applications processing. A power amplifier (PA) typically includes a discharge chamber filled with a laser gas, such as a gas including molecular fluorine, and a buffer gas. Electrodes positioned in the discharge chamber are connected to a discharge circuit, such as an electrical delay circuit, for energizing the molecular fluorine in the chamber. The discharge of the PA can be timed to be at, or near, a maximum in discharge current when a pulse from the master oscillator (MO) reaches the amplifier discharge chamber. Various line-narrowing optics can be used, such as may include one or more tuned or tuneable etalons.

A major limitation to deep-UV (DUV) excimer laser systems is the lifetime of the optical components used therein. Especially at the level of output power on the order of tens of Watts, fast decay of optical components increases downtime as well as operational costs for applications such as microlithography. While implementation of the MOPA concept can increase the output power of the laser system, one of fundamental limitations of existing MOPA systems is this relatively short optics lifetime. For example, one of the principal factors limiting the optics lifetime in a MOPA system is the fast degradation of the output window of the amplifier discharge chamber, as this optical component is typically at the point where the power is at the highest level.

DETAILED DESCRIPTION

Systems and methods in accordance with various embodiments of the present invention can employ any of a number of optical layouts and approaches in order to increase the lifetime of various system optics. These approaches can include, for example, reducing the average power density and peak intensity of a beam (or optical pulse) that passes through these optical components. This reduction can be significant for those optical components, as a high-power beam output from an amplifier in a MOPA system such as that shown in FIG. 1 can reach a power level on the order of 100 W, which can lead to significant degradation of the optical components.

Figure 1:
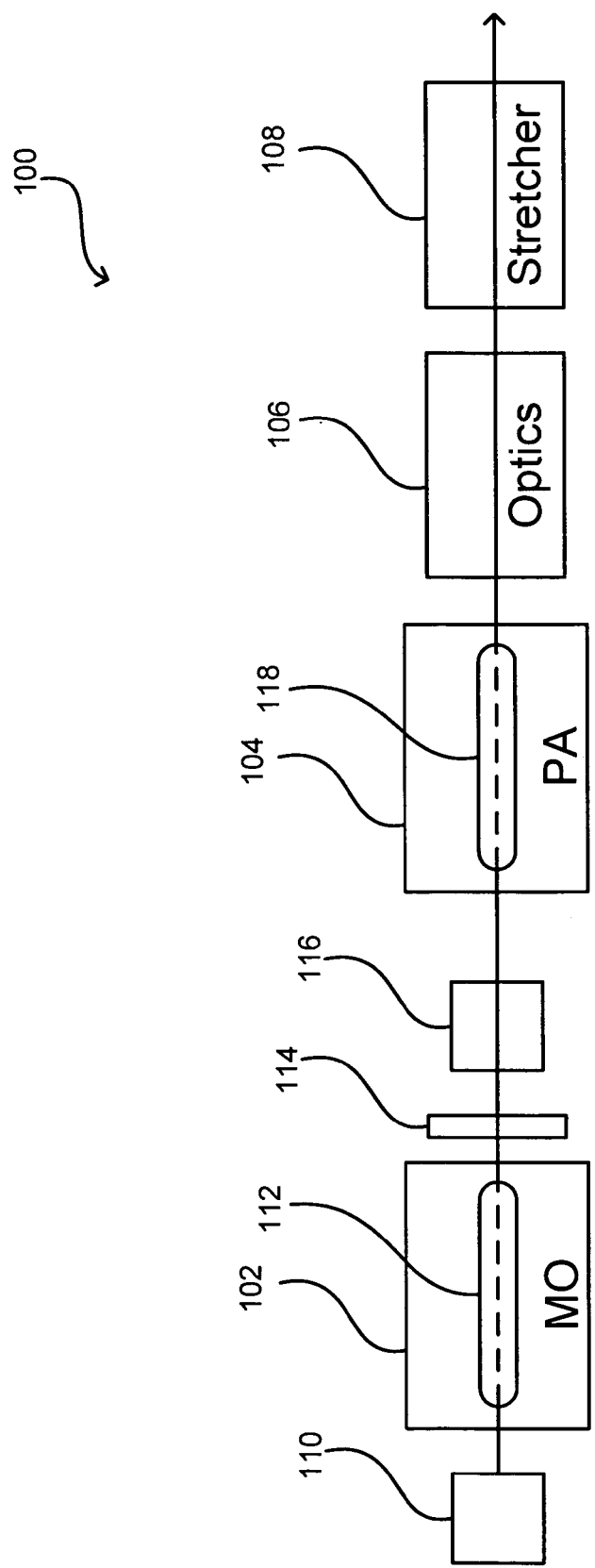
FIG. 1 shows a block diagram of an optical layout that can be used in accordance with one embodiment of the present invention.

FIG. 1 shows a top view block diagram of an exemplary optical layout 100 that can be used with a MOPA system in accordance with one embodiment of the present invention. Various other MOPA configurations, as well as detail regarding the workings of MOPA systems, are disclosed in pending U.S. patent application Ser. No. 10/696,979, filed Oct. 30, 2003, which is hereby incorporated herein by reference.

In the generalized configuration 100 of FIG. 1, a master oscillator (MO) 102 includes a first discharge chamber having disposed therein a pair of electrodes 112 on either side of a beam path through the MO for generating an optical pulse. The MO can include a line-narrowing optics module 110 for narrowing an oscillator beam (or optical pulse) in the discharge chamber, and an outcoupler module 114 for outcoupling the beam. Although not shown, it should be recognized by one of ordinary skill in the art that various other elements can be included in the oscillator which are not shown, such as output beam diagnostic tools, circuits for forming a discharge pulse, and electronic controls. Many of these components will be discussed with respect to FIG. 10.

A power amplifier (PA) 104 can be positioned along the beam path at a distance from the MO, such as a distance comparable to the pulse length in free space, or at least half of the pulse length. The beam (or pulse) can pass directly to the amplifier, or can be redirected or otherwise affected by any of a number of optical elements positioned between the oscillator and amplifier. Further, any of a number of beam expanding elements, such as a prism and a focusing lens, can be used to expand the beam before the beam passes through the amplifier. Expanding the beam can reduce the intensity of the beam, while allowing the beam to utilize more of the area between the electrodes in the power amplifier, in order to maximize the gain obtained through amplification. The beam expanding optics can produce a diverging or non-diverging beam as known in the art. Beam bending optics also can be used to alter the path of the beam, such as to direct the beam to the amplifier and/or increase the path length between the oscillator and amplifier.

The intensity of the beam between the oscillator and the amplifier is not very high, typically having pulse energy on the order of a few milli-Joules or less. Optical elements such as prisms or mirrors therefore can be used effectively. The separation between the MO and PA can cause any amplified spontaneous emission (ASE) from the PA to be delayed with respect to the initial stages of pulse formation in the MO, such that pulse formation is not disturbed. A spatial filter 116 can be located along the beam path between the MO and the PA, which can serve to further de-couple the MO and the PA, and which can modify the size of beam size as described elsewhere herein. The PA can include a discharge chamber containing at least one pair of electrodes 118 on either side of the beam path. Once the beam makes a first pass through the PA, the beam can exit as an output beam and/or can pass through a ring cavity for a second pass through the PA 104, as described elsewhere herein.

Figure 4:
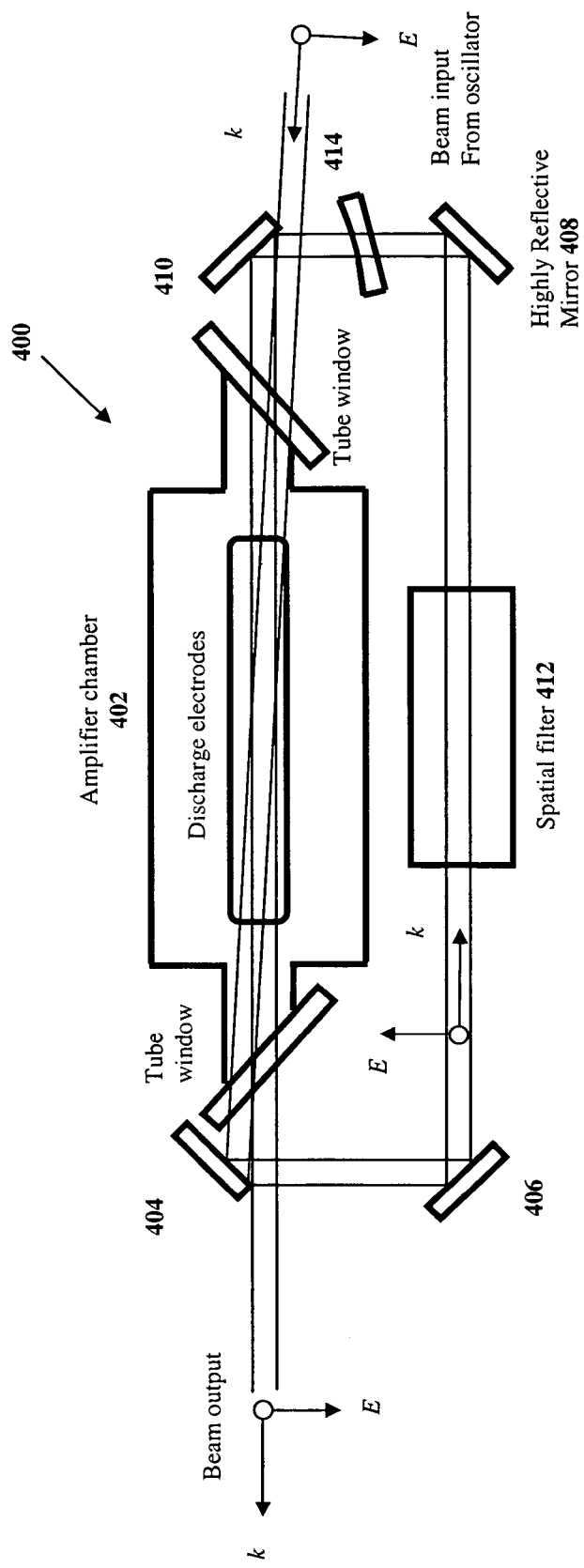
FIG. 4 shows details of a beam path that can be used in the amplifier of FIG. 1(b).

At the output of the amplifier chamber, the average power and intensity of the beam are typically the highest in the system. The first optical component that the amplified beam encounters is generally the output window that seals the amplifier chamber. This window can be an un-coated, plano-parallel window made of $CaF_2$ or $MgF_2$, for example. In order to reduce the intensity of the beam per unit area of the window, the window can be tilted with respect to the beam (as shown in FIG. 4). The intensity of the beam at the window surface can be reduced by a factor of approximately 1.5 when such a window is placed at the Brewster angle relative to the beam.

After exiting the power amplifier, the beam can pass through at least one beam bending and/or expanding optical component 106. After passing through the beam bending/expanding optic(s) 106, the beam can pass through a pulse stretcher component 108, which can effectively stretch the length of the output pulse as described below. In certain embodiments, it can be advantageous to increase the output pulse length in order to, for example, reduce the peak power in the optical components of the stepper. It also can be practical to use at least one of the beam bending/expanding optics as part of a delay line of the pulse stretcher, where possible. As known in the art, a delay line can include any of a number of reflective, refractive, or transmissive optical elements capable of directing a beam along an optical path of a predetermined length, such that the beam exits the delay line after a predetermined amount of time has passed from the entrance of the beam into the delay line. A delay line typically includes a number of turning mirrors for directing the beam.

Several beam bending and/or beam expanding optics can be used to direct and expand the beam after passing from the discharge chamber of the power amplifier. A beam bender in one embodiment includes four prisms used to fold the beam, simultaneously changing the polarization when necessary for the accompanying pulse stretcher. For instance, a pulse stretcher can be placed within the body of the laser in a vertical plane in order to allow utilize the footprint of the laser with a minimal number of beam folding optics. In order to provide an output beam in the horizontal plane, the beam can be further bent using another beam bender, which can include a pair of prisms, for example.

After passing through the beam bending and/or expanding optics, the beam can pass through a pulse stretching component 108. A pulse stretching component can be used to obtain a pulse length of around 200 ns as desired by the Lithography industry, for example, as an excimer laser typically has a pulse length around 20–35 ns. Such a pulse length can be obtained by stretching the pulse with a pulse extending/stretching component, or "pulse stretcher." The length of the output pulse after the pulse stretcher can depend on the length of the delay line inside the pulse stretcher. For optimum performance in one embodiment, the delay within the delay line should be as long as the pulse length of the input pulse. For an input pulse of 30 ns, then, a delay line length of about 30 ns is used which leads to an optical path length of about 10 m. It can be desirable for the length of the delay line to be substantially equal to the length of the input pulse, as a shorter delay time can result in overlap between the reflected and delayed pulses. Further, a longer delay time can lead to gaps between the reflected and delayed pulses.

Arranging the delay line vertically is feasible, as discussed above, but the beam may need to be folded many times in order to obtain the desired optical path length. This is due at least in part to the limited space in vertical direction of the laser device. Typically, a vertical space of about 1.5 m is available inside the laser enclosure, with an available width of less than one meter. For typical pulses on the order of 20–30 ns, the optimal delay line length then is on the order of 6–10 m. In order to obtain a path length of 10 m in such an enclosure the beam would have to be folded 6–8 times. As each mirror can introduce additional losses, it can be preferable to minimize the number of mirrors.

Figure 2A:
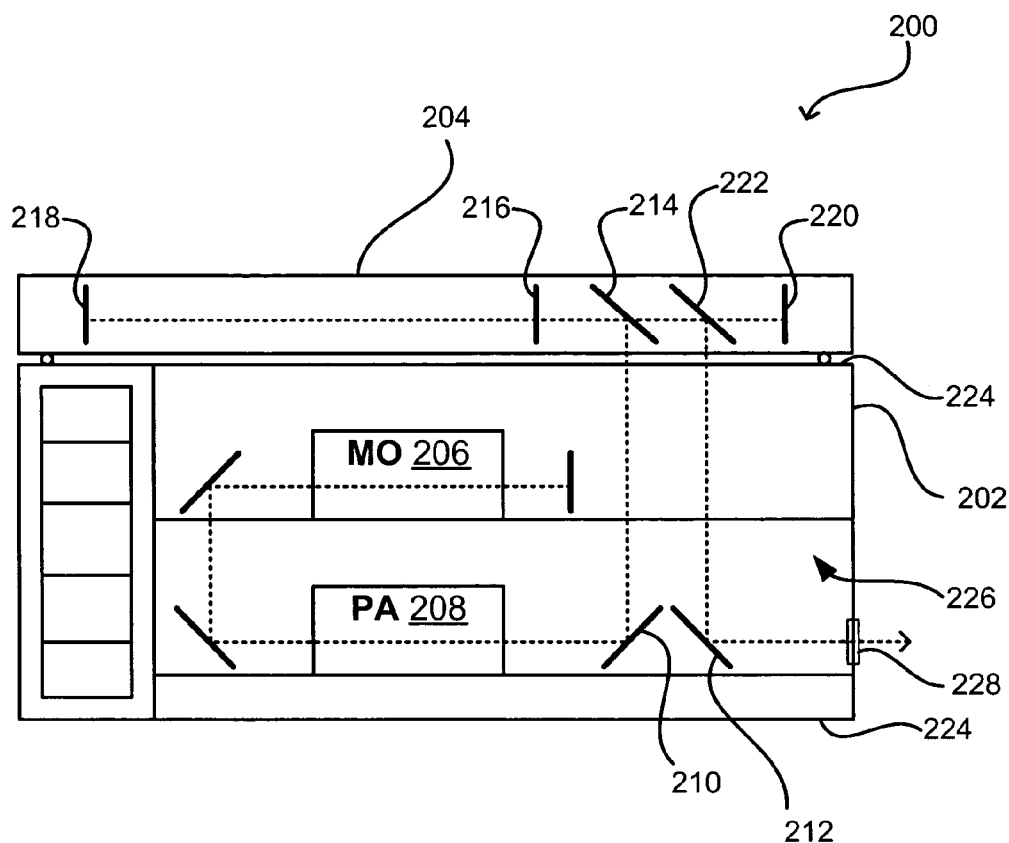
FIG. 2 shows a (a) side view of a MOPA laser system including a pulse extender module and a (b) corresponding top view of the pulse extender module top that can be used in accordance with one embodiment of the present invention.
Figure 2B:
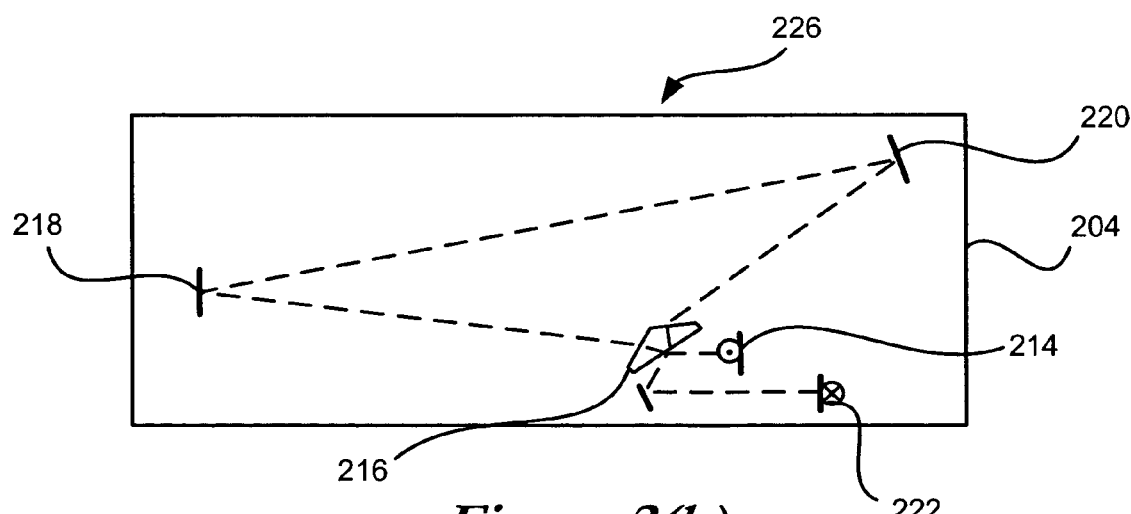

One embodiment that can provide the necessary path length while minimizing the number of additional mirrors is shown in FIGS. 2(a) and 2(b). In this exemplary system 200, a laser housing 202 is shown to contain the master oscillator 206 and power amplifier 208, as well as any turning mirrors or other components that are typically included in such a laser housing. The housing can be made out of any appropriate material, such as for example sheet metal or plastic. The housing also can have at least one output window 228 in an end panel of the housing for transmitting a generated laser beam as an output pulse. The end panels (not shown) of the laser housing 202 in this embodiment are about 1.0 m wide and 1.5 m high. This exemplary laser housing also has upper and lower horizontal panels 224 forming a top and bottom to the housing, with each horizontal panel being about 1.0 m wide and 3.0 m long. The laser housing also has vertical side panels (not shown but parallel to the plane of the Figure in FIG. 2(a)) forming sides to the housing, with each vertical panel being about 1.5 m high and 3.0 m long. A horizontal pulse extending module 204 can be placed adjacent to one of the horizontal panels 224, such as a distance above and parallel to the upper horizontal panel 224 of the laser enclosure 202. Placing the pulse extender outside the housing but parallel to one of the horizontal panels allows for use of an amount of space approximately equal to the footprint of the laser enclosure 202, which can use approximately the entire 3 m length of the housing as opposed to the 1.5 m height for vertical extenders, whereby folding the beam three to four times can be sufficient to obtain the desired path length. A horizontal pulse extender also can be more efficient and much simpler than the vertical counterpart, and can be replaced easily without interfering with the alignment or the laser itself.

Different pulse extenders can be built, each of which can stretch the pulse by a different factor based on the optical path. In a simple case, a pulse extender can provide a stretching factor of about 3.0, wherein the stretcher includes a beam splitter and three folding/imaging mirrors. More sophisticated models can include, for example, a "striped" or graded reflectivity beam splitter capable of stretching the pulse by a factor of about 4–10, or a sequential pulse extender where two individual extenders with different optical path lengths are arranged in series. Striped beam splitters are described, for example, in U.S. patent application Ser. No. 10/790,660, entitled "Optical Pulse Duration Extender," filed Mar. 1, 2004, which is hereby incorporated herein by reference. The pulse extending module can be contained within a housing of a comparable footprint and/or material to that of the laser housing.

As seen in the side view of FIG. 2(a), a horizontal beam (or pulse) exiting the oscillator chamber 206 and passing through the amplifier chamber 208 can be folded vertically by a mirror 210 and/or at least one prism. The folded beam can leave through one of the horizontal housing panels 224 of the laser enclosure 202 and enter the pulse extender module 204. There, the beam can be folded back onto the horizontal axis by a folding mirror 214, and can directed to a beam splitting element 216, such as a dielectrically-coated plate or a prism beamsplitter as discussed below. The beamsplitter can cause a portion of the beam to be reflected to a folding mirror 222 that directs the beam out of the pulse extender module and back into the laser enclosure 202. The remaining portion of the beam can be directed by the beamsplitter through a delay line of the pulse extender, here including relay imaging mirrors 218 and 220. After passing through the delay line, at least a portion of the delayed beam can be directed to folding mirror 222 and directed back into the laser enclosure 202. At the desired exit height, for example, the beam can be reflected by a mirror 212 and/or at least one prism onto the horizontal axis. Additional mirrors, prisms, or other steering optics can be used to steer the output beam, either before or after exiting the laser enclosure 202 through an output window 228. Extending the pulse can reduce the intensity of the pulse, such that the life of the output window is extended.

The path of the beam inside the pulse extender can include any appropriate path, such as the example shown in the top view of FIG. 2(b). Here, after mirror 214 folds the beam into the horizontal plane, a triangular beam path is created by beamsplitter 216 and folding elements 218 and 220. It should be understood that any of a number of paths, such as rectangular or irregular beam paths, can be created using any number of turning elements as known in the art, in order to obtain the proper path length in the available amount of space, and should not be limited to the examples discussed herein. After the beam has passed through the optical delay line of the pulse extender module 204, another folding optical element (or the same as the input element) can direct the beam back into the laser enclosure for output as an output pulse. Redirecting the beam through the original output window of the laser enclosure prevents the need to realign the optics or adjust the footprint of the overall system.

Figure 3A:
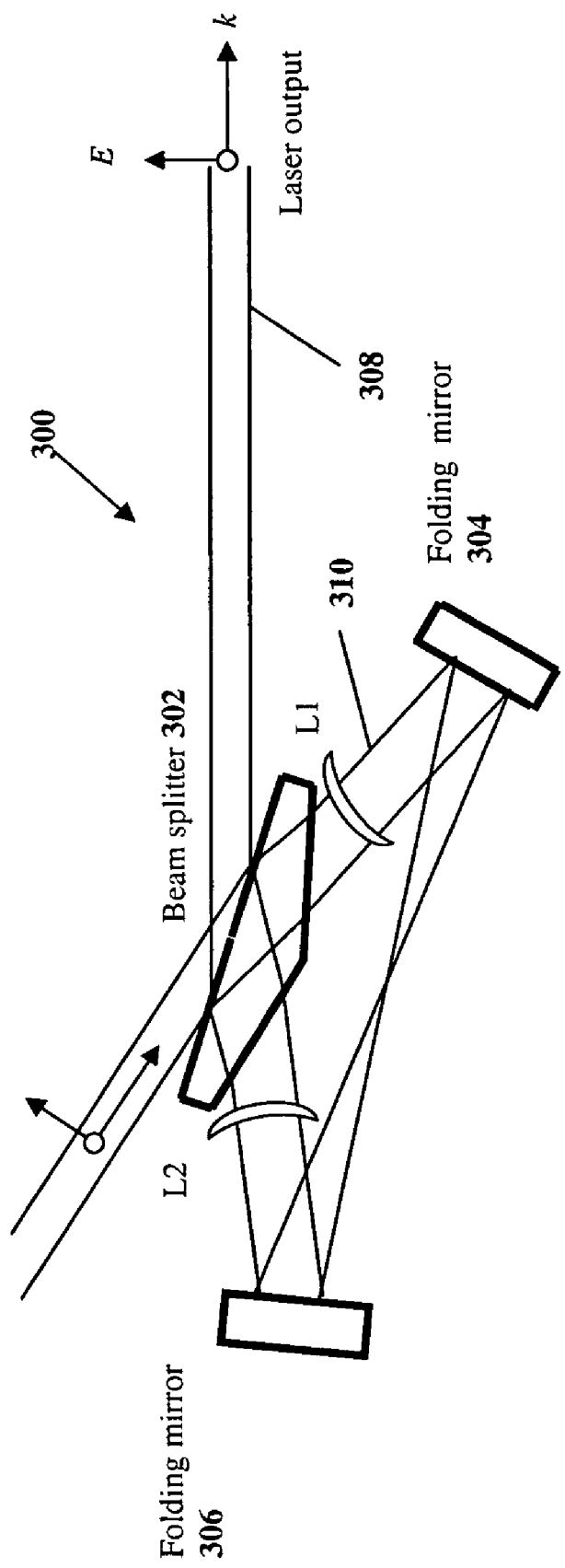
FIG. 3(a) shows details of a beamsplitter arrangement that can be used in accordance with one embodiment of the present invention.

In another embodiment, a beam exiting the discharge chamber of the power amplifier, which may also pass through a set of beam bending and/or expanding optics, can pass through a pulse extending (or pulse stretching) component 300 such as that shown in FIG. 3(a). This pulse stretching component can consist of a beamsplitter 302 and at least two folding and imaging mirrors 304, 306. While this pulse stretching module can be used as a stand-alone module, such as in a vertical orientation, it should be understood that the approach also could be used with the horizontal pulse extender module of FIG. 2(a). The beamsplitter 302 has a substantially planar first surface that can reflect a portion 308 of the pulse energy towards the output. If an optical pulse is incident on the planar first surface at a shallow angle, such as about 9° relative to the plane of the surface, then the reflected portion will be reflected toward the output window at an angle of about 9° relative to the surface. At least one beam bending element can be used to direct the reflected portion to the output window where necessary. In another embodiment, any necessary beam bending can be done before the beamsplitter, with the beamsplitter being oriented such that the reflected portion is reflected directly to the output window along the output beam path.

The portion of the optical pulse that is not reflected by the first surface will be substantially transmitted through the beamsplitting element as a transmitted portion 310. If the beamsplitting element was a planar plate as in existing systems, the beam expansion in the beamsplitter would be compressed away upon exit of the beamsplitter. Since the present embodiment uses a beamsplitting prism 302, shown in more detail in FIG. 3(b), the angled second surface 322 opposite the planar first surface 320 allows the transmitted portion to be expanded when exiting the beamsplitting prism. The amount of expansion can be controlled by the angle of the second surface 322, relative to the planar first surface 320 and the angle of incidence of the optical pulse on the first surface. For instance, the second surface 322 of the beamsplitter 302 is shown to form an apex angle θ with the third surface portion 324. Each of the second and third surfaces is angled with respect to the first surface, such as an angle of about 7°–9° in FIGS. 3(a) and 3(b). In one example, the prism is an equilateral prism with an apex angle of about 165°. For this example, the preferred range is between about 155° and 175°. The angle causes the beam to be expanded by about a factor of 3 when exiting the second surface of the beamsplitting prism. The amount of expansion can be selected to obtain a desired reduction in intensity of the beam, in order to extend the lifetime of the system optics. In FIG. 3(a), the expanded beam passes through a delay line and back to the third surface 324. Since the second surface and third surfaces are similarly angled with respect to the first surface, but in the opposite direction, the expanded beam will be compressed when passing back through the beamsplitting prism, such that the transmitted beam exiting the first surface will be approximately the same width as the original beam that was incident on the first surface. Further, the path of the transmitted beam will be substantially the same as the path of the reflected beam. This allows both the initial and delayed beam portions to follow the same output path without any additional optical elements. In one embodiment, the delay line is configured such that the transmitted portion intersects the second and third surfaces of the prism at similar angles in order for the initial and delayed portions to follow the same exit path.

The transmitted portion 310 of the pulse is delayed with respect to the reflected portion 308 by an amount that equals the time for the transmitted pulse to follow one round-trip through the delay line formed in part by mirrors 304, 306. While at least a portion of the pulse can be added to the output upon transmission through the beamsplitter 302, a portion of the transmitted beam can be reflected by the first surface and directed back through the delay line. A reflected portion of the delayed pulse then can be further delayed in subsequent round-trips through the delay line. The output of the pulse stretching component in this embodiment then is a series of pulses spaced apart by a time interval defined by the delay line, with a correspondingly diminished energy per pulse. The resulting "Time-Integral Square" (TIS) length of the output pulse is increased, as compared to the input pulse. The resulting central waveform of such an output pulse can be as shown in FIG. 3(c). The solid line 350 in the plot represents the overall intensity of the output pulse waveform, while the dashed lines 352, 354 represent the individual intensities of output pulses from individual round trips in the delay line. The separation between peaks of the output pulses due to the delay line can be seen. The amount of delay in the delay line can be, for example, approximately equal to the incident pulse length at the $1/e^2$ level. A greater delay typically will not provide a significant increase of the TIS pulse length, but typically will require more space. At the same time, a shorter delay can decrease the output TIS. The transmission/reflection ratio of the beamsplitter can be adjusted in such a way that the first two output pulses of the waveform are of approximately equal energy, thereby providing a nearly-maximum TIS pulse length-stretching ratio. In one example, a transmission rate of about 65% has been shown to be effective, assuming losses of about 17% in the delay line.

Figure 3B:
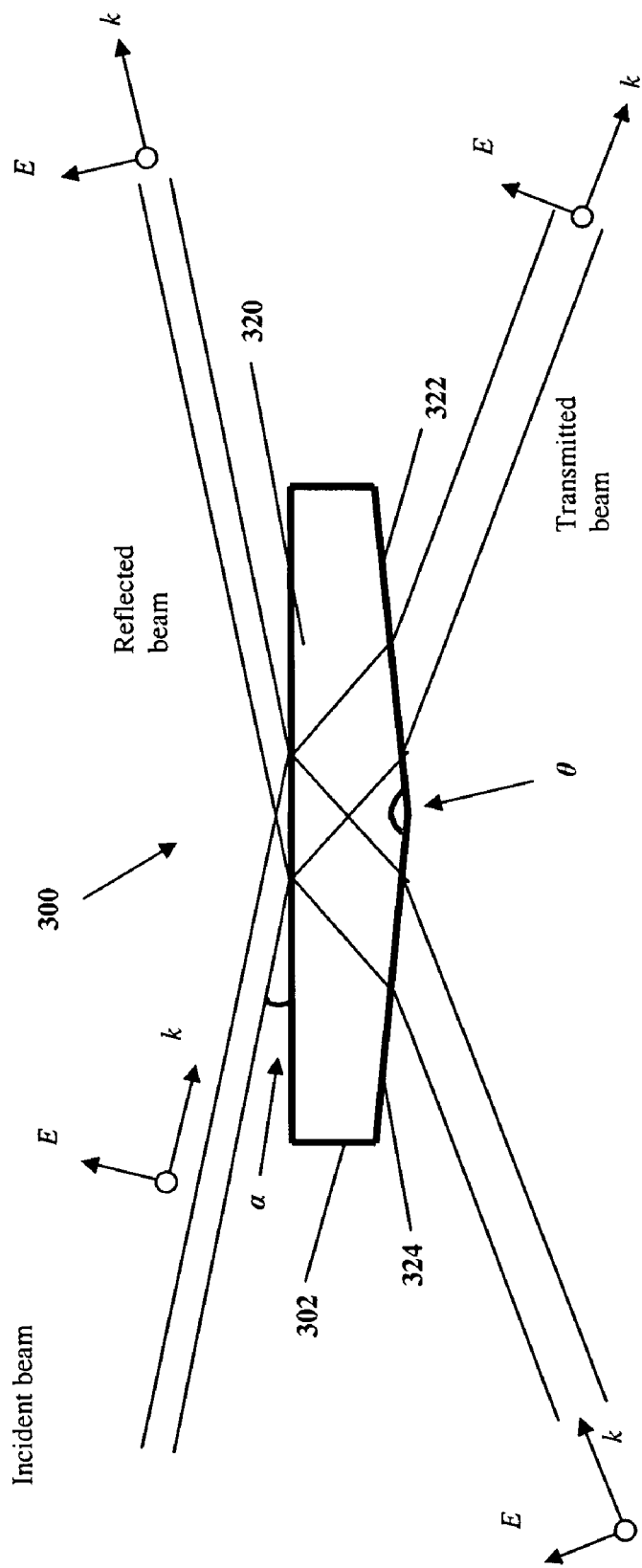
FIG. 3(b) shows a detailed view of beam portions at the beamsplitter of FIG. 3(a).
Figure 3C:
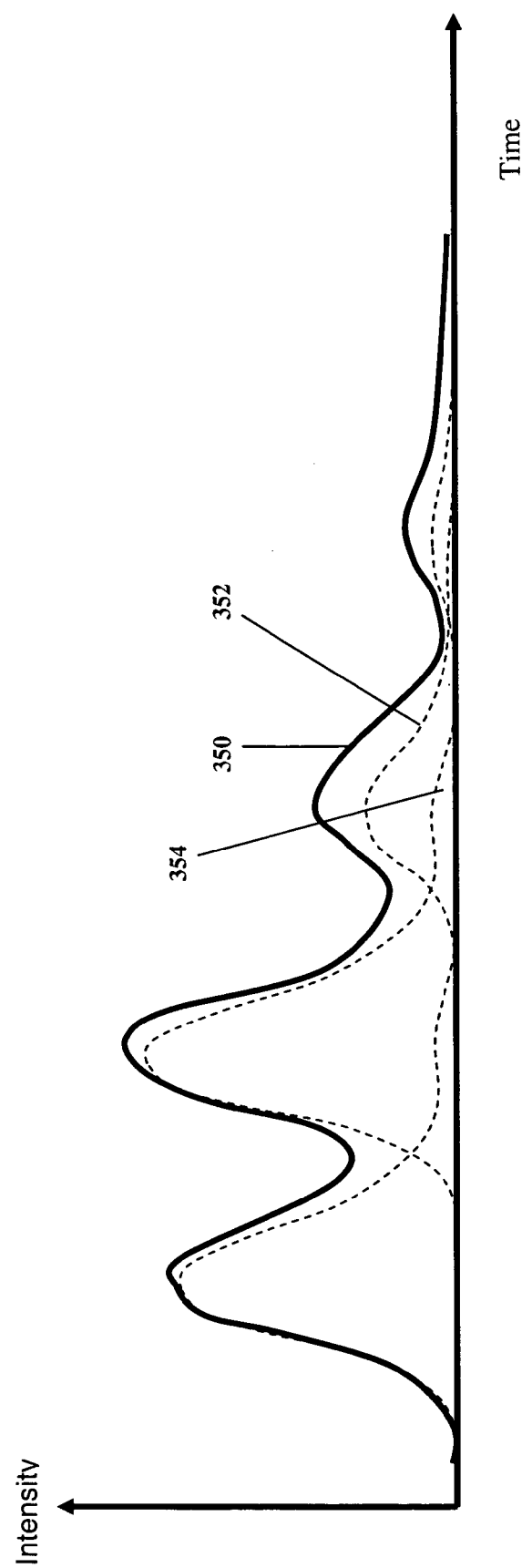
FIG. 3(c) shows an exemplary pulse stretcher output waveform.

As shown in FIGS. 3(a) and 3(b), the beamsplitting element 302 can be an equilateral prism, where the second and third surfaces 322, 324 can have an apex angle θ that, for at least one embodiment, is optimally between 90° and 180°, or between 90° and 165°. Smaller apex angles can increase the expansion of the beam transmitted from the second surface 322 of the beamsplitter, as described below, while larger angles can reduce losses due to reflection and can allow for a thinner overall prism. It can be advantageous to use a prism that is as thin as possible, as certain materials are not completely uniform and can cause artifacts and/or losses in the beam. The apex angle θ of the embodiment shown in FIG. 3(b) is approximately 165°. The apex angle can determine the expansion of the transmitted beam in the delay line, and also can affect the shape and/or footprint of the delay line by affecting the angle at which the transmitted beam exits the beamsplitter. The selection of the apex angle can strike a balance between beam expansion and intensity losses due to reflection at the second surface of the prism. An apex angle that results in the transmitted beam exiting the second surface in a direction normal to the second surface can provide the greatest amount of beam expansion, but also can experience the highest amount of intensity loss due to reflectance from the second surface, such as a loss on the order of about 4%. It therefore can be necessary to select the apex angle to balance the amount of possible beam expansion with the amount of acceptable intensity loss. In the embodiment of FIG. 3(b), it was found that an acceptable balance was obtained with an apex angle of about 165°. With an apex angle of 165°, an incidence angle of 81° relative to normal results in a beam expansion of a factor of 3.2, with minimal losses due to the beam striking the second surface at the Brewster angle. If the apex angle were 98°, by comparison, the beam expansion would be about a factor of 4.8, with losses at the second surface on the order of 4%.

A beamsplitting prism 302 can be made of any appropriate material, such as $CaF_2$, excimer-grade fused silica, magnesium fluoride, or sapphire, for example. Since the angle of the prism relative to the incident beam is used to control the reflectance, and the apex angle of the prism is used to control the bending and expansion of the transmitted beam portion, no partially reflective coating or dielectric coating is required on the first, second, or third surfaces. The lack of such a coating can provide for a longer lifetime than is observed for coated beamsplitters. Further, use of such a prism allows the beam to be spread over a larger surface area than other beam splitters due to the range of apex angles, allowing for a lower intensity per unit area and a corresponding increase in optic lifetime.

As shown in the example of FIG. 3(b), an incident beam (or pulse) can intercept a first surface 320 of the beamsplitter at a predetermined angle α, which in this case is at an angle of approximately 8.4° such that the incident ray strikes the first surface at about 81.6° from normal to the surface 320. The angle at which the incident beam strikes the first surface 320 of the beamsplitter can be selected in order to obtain the desired reflectance from the first surface. Using such small angles allows reflectances on the order of 25%–35% to be obtained, such that there is no need for a reflective, or partially reflective, coating on the first surface. The reflectivity $R_p$ of the uncoated surface of a prism beamsplitter can be determined by the following Fresnel formula:

$$R_p = \left[\frac{\tan(\phi_1 - \phi_2)}{\tan(\phi_1 + \phi_2)}\right]^2$$

where $\phi_1$ and $\phi_2$ are the incidence and reflection angles, respectively. For example, a prism made of $CaF_2$ with a refractive index of 1.5 at 193 nm can have a preferred range of incidence angles of about 80°–83° relative to the surface normal. Since the beamsplitter does not have a coating on the first surface as in the prior art, the manufacture of the beamsplitter can be simplified, and the lifetime of the beamsplitter extended.

A beamsplitting prism can be designed, and aligned relative to the incident beam, such that the transmitted portion of the incident beam traverses the second surface 322 at nearly the Brewster angle, with no theoretical loss. The transmitted beam also will be expanded by a factor of about 3.44 in this example, which can help to reduce the intensity of the beam on the folding mirrors. Similarly, the delayed beam can pass through the third surface 324 and can again be incident onto the first surface 320, such that at least a portion of the delayed beam exits from the first surface at about 81.6° relative to the normal. The transmitted portion of the delayed beam can be compressed by a ratio of about 3.44, or back to the approximate width of the original optical pulse, and can be added to the output of the pulse stretching component. Thus, the beam size is substantially restored upon a complete round-trip through the beamsplitter and delay line. The process can repeat a number of times, as a portion of the delayed beam will continue to be reflected by the first surface as long as the beam contains a sufficient amount of energy, providing delayed output pulses with potentially diminishing intensity.

Figure 3D:
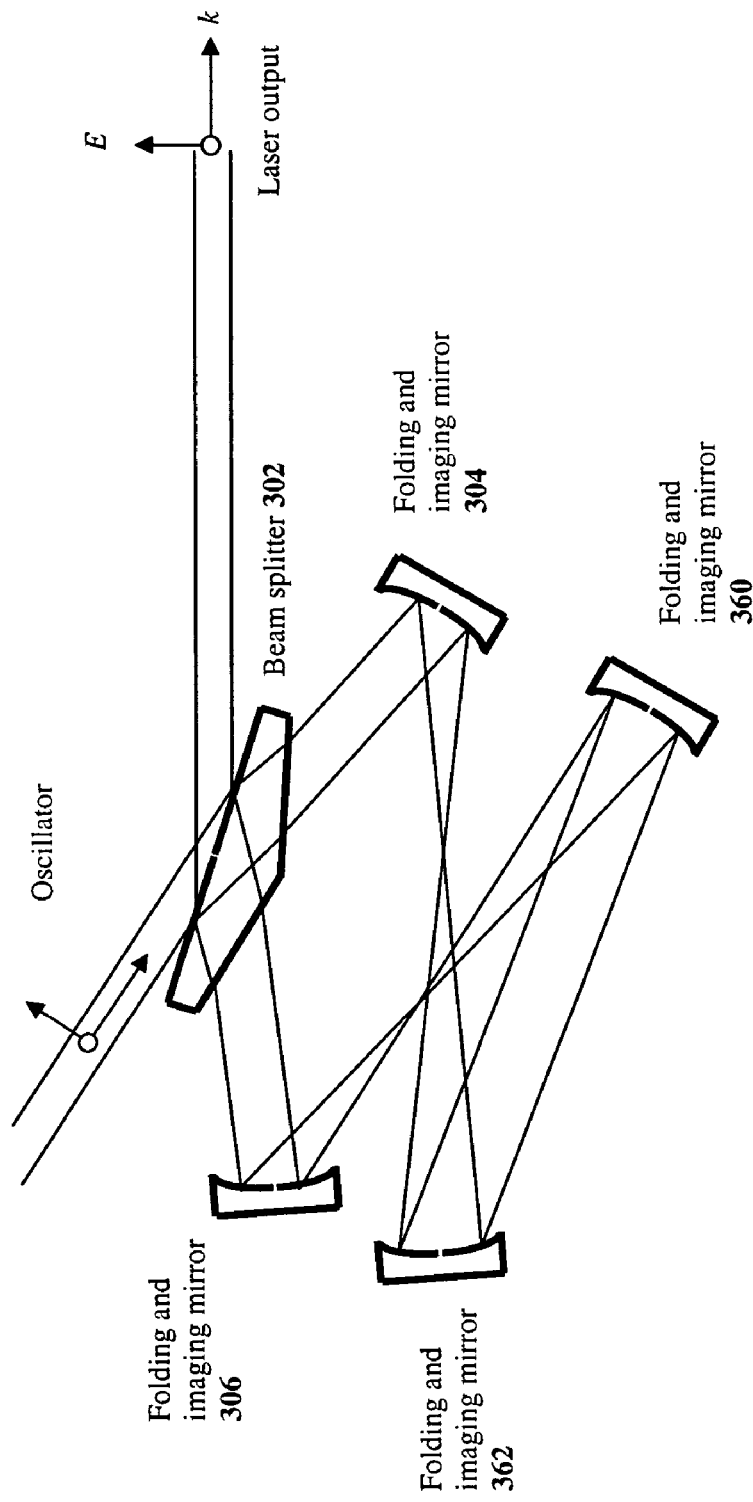
FIG. 3(d) shows details of another beamsplitter arrangement that can be used in accordance with one embodiment of the present invention.

As shown in FIG. 3(a), imaging mirrors 304 and 306 can be used to provide relay imaging of the beam from the input to the output of the delay line. In the embodiment of FIG. 3(d), the imaging mirrors are concave, spherical mirrors with a radius of curvature approximately equal to the distance between the mirrors. Alternatively, one can use lenses with flat mirrors as shown in FIG. 3(a). In such an embodiment, the total delay in the delay line can be about 20 nsec, which can require about 3.0 meters of distance between mirrors 304 and 306. However, if such space is not available in the laser enclosure, one can use additional folding mirrors 360, 362 as shown in FIG. 3(d). Such an approach can be expanded to include additional folding mirrors in similar fashion, in order to obtain the desired delay in a smaller physical space. However, additional optics can increase optical losses and cost, as well as the complexity of alignment. It therefore can be desirable to use the minimum amount of turning mirrors necessary to obtain the desired path length from the available space. For example, in order to obtain a 10 m path length in a 3 m space, four mirrors can be used as in FIG. 3(d) to obtain four paths each of approximately 2.5 m in length.

Figure 3E:
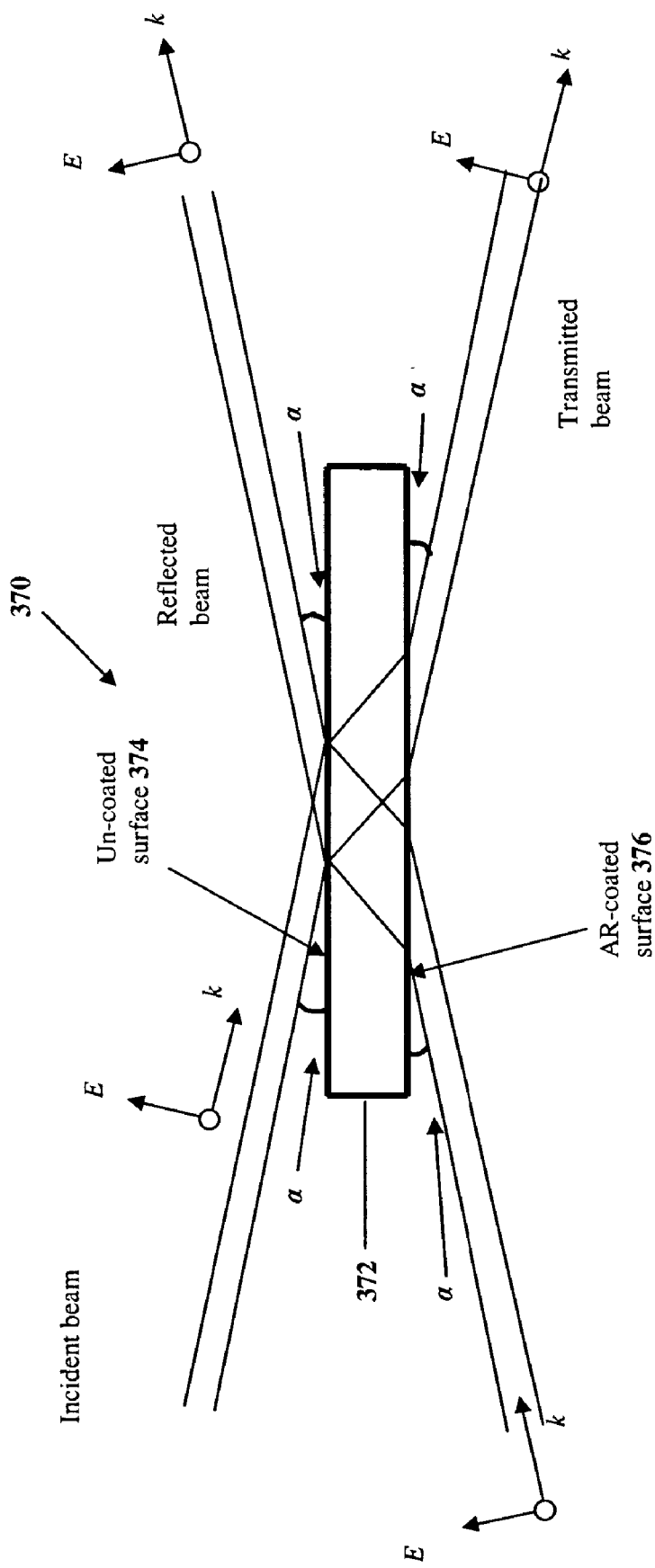
FIG. 3(e) shows details of another beamsplitter arrangement that can be used in accordance with one embodiment of the present invention.

A beam splitting component 370 in accordance with another embodiment is shown in FIG. 3(e). Here, the beamsplitter 372 is a plano-parallel plate with substantially parallel first and second surfaces 374, 376. The second surface 376 can be coated with an anti-reflective (AR) coating. As discussed with respect to FIGS. 3(a) and 3(b), an incident beam (or pulse) can intercept a first surface 374 of the beamsplitter at a predetermined angle α, which again can be an angle of approximately 8.4°, such that the incident ray strikes the first surface at about 81.6° from normal to the surface 374. The angle can be selected in order to obtain the desired reflectance from the first surface, such as a small angle allowing a reflectance on the order of 30%–35%. Being able to obtain such a reflectance capability allows the beamsplitter to be used without a reflective, or partially reflective, coating on the first surface 374. Since the beamsplitter does not have a coating on the first surface as in the prior art, the manufacture of the beamsplitter can be simplified and the lifetime of the beamsplitter extended. The transmitted portion of the beam will be expanded as the beam passes through the beamsplitter, but will be compressed back to approximately the same width upon exiting the second surface 376. A significant advantage of using small incidence angles is that the spot size formed by the transmitted portion of the beam on the second surface will be significantly expanded, such that the energy will be spread out over the surface and any coating on the second surface will encounter a much lower intensity beam than in other existing systems. This lower intensity can greatly increase the lifetime of the coating on the second surface. The beam should exit the beamsplitter at approximately the same angle as the angle of incidence α, due to the plano-parallel nature of the plate. Upon returning to the beamsplitter, the beam can be incident upon the second surface 376 at an angle of approximately α. Again, since α is a relatively small angle the spot size formed on the second surface due to the returning beam will be significantly expanded, as the spot size increases as the incident angle of the beam moves away from a normal to the surface. This expansion leads to a lower intensity on the coating and a corresponding longer lifetime.

An anti-reflective coating can be applied to the second surface 376 in order to prevent reflection of the returning beam. The returning beam again can be expanded while passing through the beamsplitter, and re-compressed upon exiting the first surface 374. The transmitted beam can exit the beamsplitter at approximately the same location and along the same path as the reflected beam portion. An advantage to such an embodiment is a relatively simpler manufacturing process than an apex prism or dielectrically coated prism, with potential disadvantages of a degradation of the anti-reflective coating and a loss of beam expansion capability. Additional mirrors may be needed to direct the beam at the appropriate small incidence angles required for such an approach, as existing systems utilizing partially reflective dielectrically coated beamsplitters, for example, typically have an incidence angle of approximately 45° or at an angle that is approximately normal to the surface.

Beam Path Around the Amplifier

In many embodiments of the present invention, additional advantages can be obtained by using a regenerative power amplifier configuration. In a "regenerative" amplifier configuration, an oscillator beam (or optical pulse) received from an oscillator, or at least a portion of the beam, makes at least two separate passes through the discharge chamber of the amplifier. The use of at least one additional pass can allow for an increase in gain, allowing for lower input pulse energy. A multi-pass configuration also can allow the system to effectively "stretch" the amplified pulse, which can lead to a relaxed requirement of the synchronization precision and, therefore, greater pulse energy reproducibility. Stretching the beam also can lower the intensity at the output optics as discussed elsewhere herein. Optical decoupling can be used between the PA and the MO, as well as between passes of a beam through the PA, whereby a high output pulse energy can be obtained with low energy fluctuations. Further, ASE can be suppressed to less than 0.1% of the total laser output.

FIG. 4 shows a top view diagram of an amplifier 402 of a MOPA system, such as that of FIG. 1, which in this embodiment includes a double-pass configuration, wherein reflecting mirrors 404, 406, 408, 410 are used to direct the beam such that the beam double-passes the amplifier chamber. The beam crosses through the PA at a different angle for each pass, such as an angle of approximately 0.7° as described in U.S. patent application Ser. No. 10/696,979, incorporated by reference above. After exiting the MO and passing through a spatial filter and any beam shaping optics, the beam can be directed through the PA at an angle that is substantially non-parallel to the long axis of the PA electrodes 116. The beam then can be redirected by a pair of HR mirrors 404, 406 through a spatial filter 412 and any beam shaping optics. The beam only passes through the spatial filter 412 after being redirected by HR mirrors 404, 406. The beam shaping optics, which can include for example a diverging lens as discussed above, can function in one embodiment to widen the beam before the beam makes a second pass through the PA. The beam then makes a second pass through the PA, at another angle substantially non-parallel to the long axis of the PA electrodes before exiting the system. The differing angles, and any differing sizes, of the beam between passes allows the passes to have minimum interference with one another, providing a cleaner separation of the "incoming" and "output" beams. In another embodiment, one of the passes of the beam through the PA can be made collinear to the chamber axis, or parallel to the long axis of the electrodes. The beam can also be the same width for both passes, although it can be desirable to widen the beam for the second pass in order to lower the intensity of the once-amplified beam.

Figure 5:
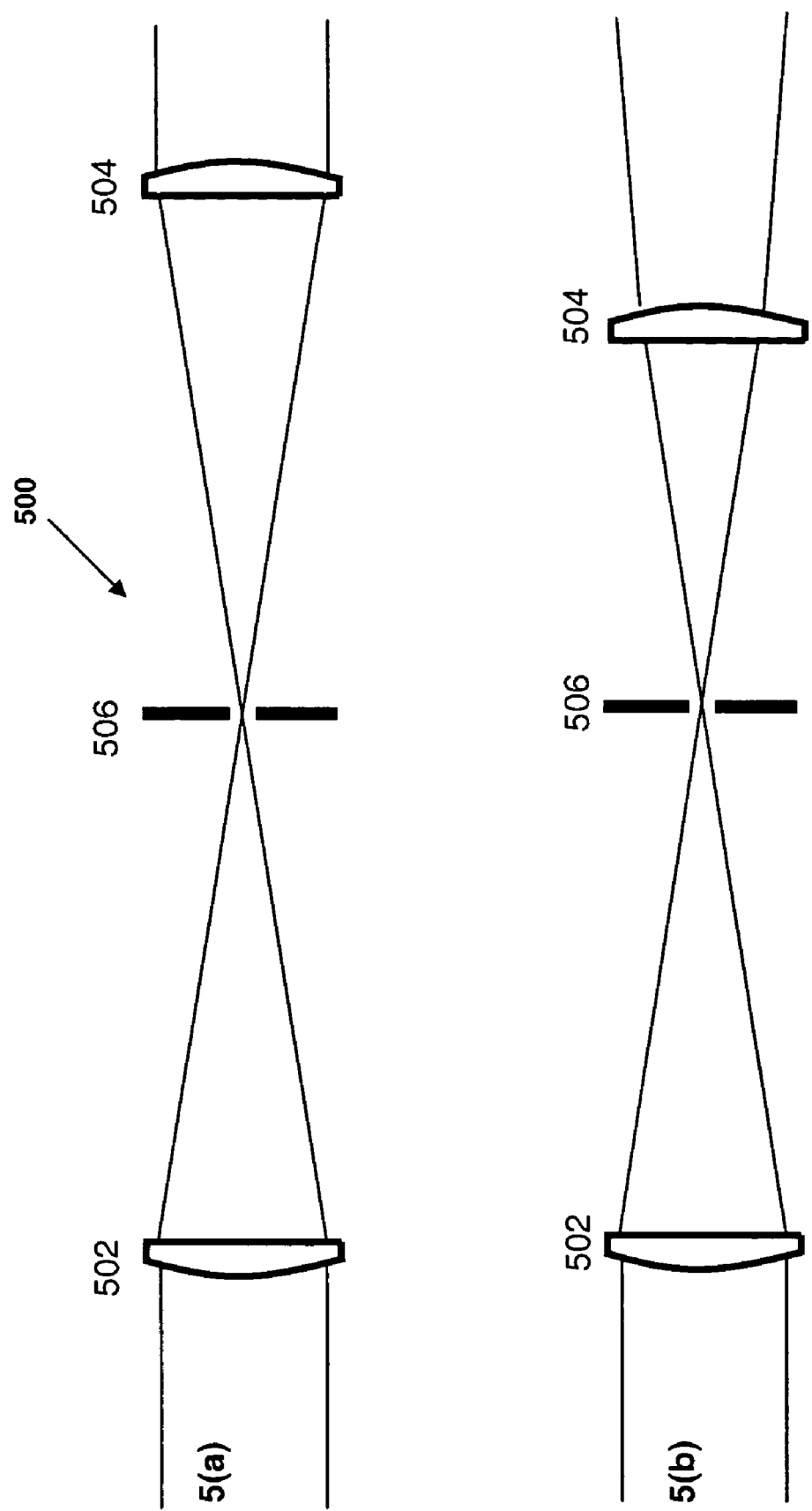
FIGS. 5(a) and 5(b) show details of a spatial filter that can be used in accordance with various embodiments of the present invention.

A spatial filter similar to that used in the arrangement of FIG. 4 is shown in more detail in FIGS. 5(a) and 5(b). Spatial filters in general are well known in the art, and are commonly used for removing high-spatial frequency features from beams, as well as combining the functions of magnification and imaging. See, for example, J. T. Hunt, P. A. Renard, W. W. Simmons, Applied optics, vol. 16, p. 770 (1977) or J. T. Hunt, J. A. Glaze, W. W. Simmons, P. A. Renard Applied Optics, vol. 17, p. 2053 (1978). Spatial filters can consist of two spherical lenses, which form a focal point between the lenses. A pinhole or other aperture can be placed at the focal point, so that only the highly spatially coherent (low divergence) portion of the beam is transmitted. In certain embodiments, cylindrical lenses are used instead of commonly used spherical lenses, and a slit aperture is used instead of a pinhole. Since the beam is focused into a slit aperture instead of a pinhole, the intensity in the focal point can be reduced by orders of magnitude as compared to a standard pinhole-based spatial filter. Thus, wear and damage to the slit aperture can be greatly reduced.

FIGS. 5(a) and 5(b) show embodiments of an exemplary spatial filter 500 that can be used in an arrangement such as that shown in FIG. 4. A spatial filter 500 can consist of two positive lenses 502, 504 and an aperture 506. The positive lenses can be cylindrical or spherical, for example, and the aperture 506 can comprise a pin-hole or a slit in these cases, respectively. One difference between the embodiments of FIGS. 5(a) and 5(b) is that in FIG. 5(b), the second positive lens 504 is moved closer to the slit (or pin-hole) than the focal length of the lens. In this case, the output beam will be divergent at the input of the final pass of the amplifier. This divergence of the beam can help to reduce the intensity of the beam at the output window of the amplifier, where the intensity is typically the highest in the system. The positive lenses 502, 504 can be placed as close to the tube windows as possible. For example, in the arrangement of FIG. 4 the positive lenses can be placed between highly reflective mirrors 408 and 410, and between 404 and 406 respectively. Aperture 506 can be omitted if no spatial filtering is required. With the aperture omitted, the spatial filter can act as a relay imaging arrangement, possibly with simultaneous divergence-increasing functionality.

Figure 6:
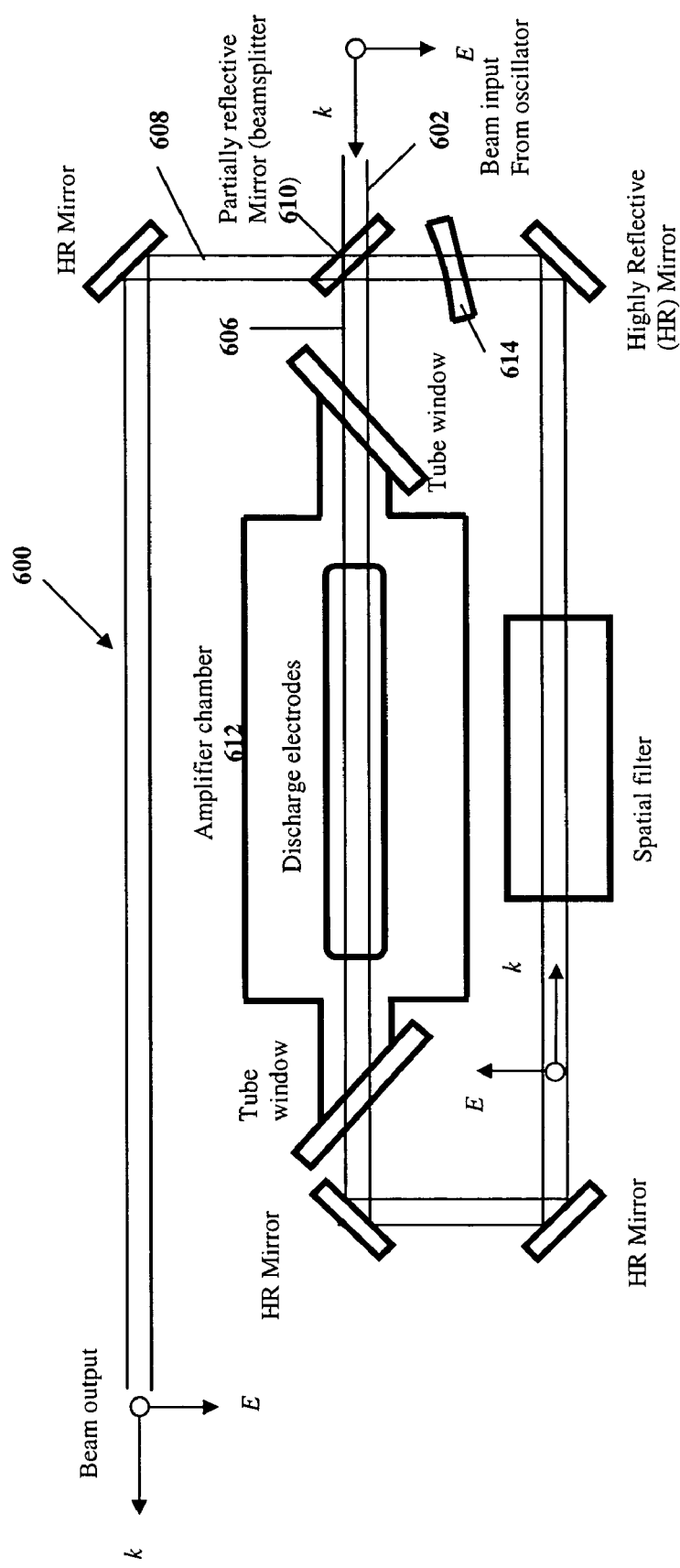
FIG. 6 shows details of another beam path that can be used in the amplifier of FIG. 1(b).

FIG. 6 shows an amplifier setup in accordance with another embodiment of the present invention, wherein an input beam 602 from a master oscillator passes directly through a partially reflective beamsplitter 610 along the beam path before reaching the amplifier chamber 612. The transmitted beam 606 is amplified in the chamber and passed through a delay line back to the beamsplitter 610. At the beamsplitter, a portion of the beam is transmitted through the beamsplitter as an output beam 608. The remaining portion of the amplified beam is directed back through the amplifier chamber 612 and the delay line. The twice amplified beam portion will again pass back to the beamsplitter 610, where a portion will be directed as an output beam, with a delay relative to the first output beam related to the length of the circular delay line, and a portion will again be redirected through the amplifier and delay line. This regenerative amplification process can repeat several times, limited only by the presence of sufficient gain in the amplifier, with a portion of the energy being transmitted through the beamsplitter 610 as output for each pass through the delay line. A negative lens 614 can be placed along the ring path such that the divergence of the beam is increased for each subsequent pass through the amplifier, in order to reduce the intensity of the amplified pulse exiting the PA 612. The position of the negative lens in FIG. 6 causes the beam divergence to be increased only after the first pass of the beam through the amplifier. This embodiment creates a stretched pulse at the output of the amplifier, which can reduce the peak intensity of the output pulse and minimize damage to a projection lens (not shown) of the system. Embodiments can include telescopes and spatial filters such as those shown in FIGS. 5(*a*) and 5(*b*), for example.

In order to input and output a portion of the beam, the beamsplitter 610 (here also serving as the input and output mirrors of the ring cavity) can be partially reflecting. The product of the reflectivities of the "input" and "output" partial reflector portions must be small enough to not cause oscillations in the ring cavity formed by the partial reflectors and reflecting mirrors of the ring cavity. At the same time, the total transmittance through the ring cavity path has to be sufficient to create usable input for the second pass through the amplifier. A fundamental assumption in this approach is that the pulse evolution from the noise level in the ring cavity takes longer than the arrival time of the pulse from the oscillator, such that the output consists primarily of the amplified main pulse and not ASE. Using this assumption, the feedback does not necessarily have to be below the oscillation threshold in the absence of the main beam from the oscillator. One potential disadvantage to such an approach is the potential for an increased level of ASE. Beamsplitter 610, however, can substantially prevent ASE from traveling back to the MO.

Figure 7A:
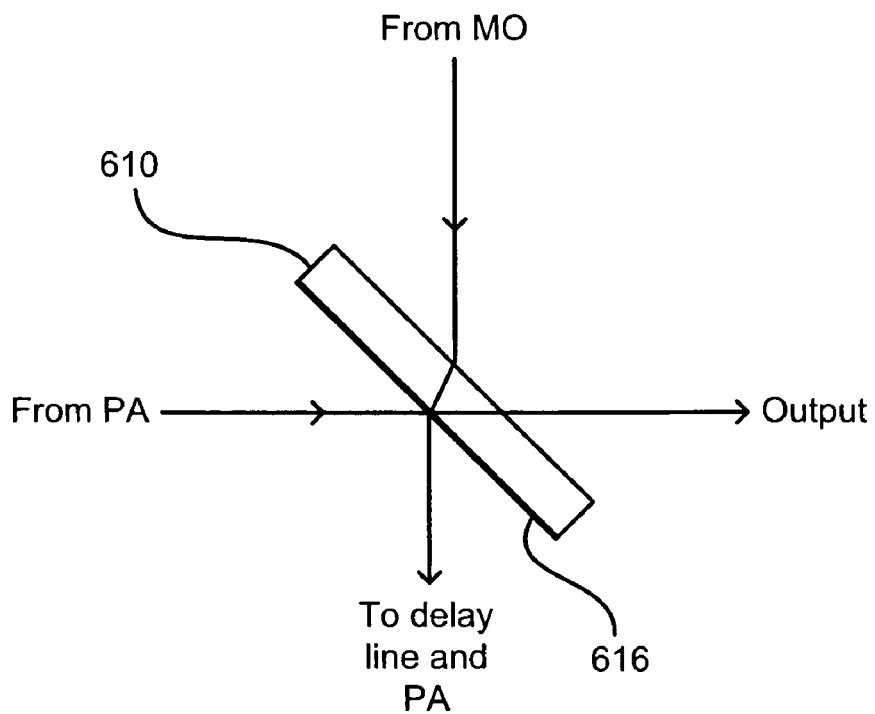
FIG. 7 shows details of (a) a coated plate beam splitter and a (b) prism beam splitter that can be used with the arrangement of FIG. 6.
Figure 7B:
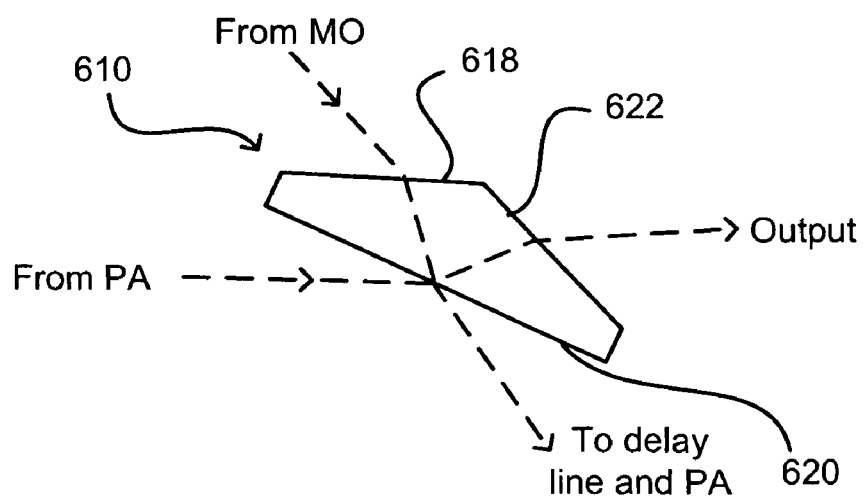

Examples of a beamsplitter 610 that can be used in the arrangement of FIG. 6 are shown in FIGS. 7(*a*) and 7(*b*). In FIG. 7(*a*), the beamsplitter is a parallel plate beamsplitter having a dielectric coating 616 on the second surface. In FIG. 7(*b*), the beamsplitter is a prism beamsplitter as discussed above. For this prism setup, however, the beam from the MO is incident on what was previously referred to as the second surface 618 and passes into the delay line from what was previously referred to as the first surface 620. One reason for rotating the prism is to prevent any portion of the beam from being reflected from the first surface such that the portion passes as output without ever having passed through the power amplifier. A potential disadvantage to such an orientation, however, is that the beam can be compressed when passing from the first surface 620. In this case, it is possible to use beam expanding optics such as a negative lens (not shown) to expand the compressed beam in order to extend the lifetime of the delay line and amplifier optics. Since the beam would be re-expanded when exiting the third surface 622, a beam narrowing element (not shown) can be used before or after the beam passes through the beam splitter and exits as an output beam.

Such an approach can be used to create a stretched pulse at the output of the amplifier, which can reduce the peak intensity of the output pulse of the system. Further, the direction of the beam is always away from the oscillator (not shown) while passing through the amplifier. A variety of such beam paths can be used with an amplifier of a MOPA system, such as are disclosed in pending U.S. patent application Ser. No. 10/696,979, filed Oct. 30, 2003, and Ser. No. 10/776,137, filed Feb. 11, 2004, each of which is incorporated herein by reference. The use of a ring cavity or circular beam path can help to minimize the amount of ASE that can otherwise disturb the operation of oscillator. The position of the reflecting mirrors can be adjusted to increase the beam path in the ring cavity to increase the "time window" of the amplification, resulting in the overall gain being less sensitive to the time jitter between successive discharges. The ring cavity can include a spatial filter as described below with respect to FIG. 5. Additionally, or instead of a spatial filter, a negative lens can be used along the beam path in the cavity. The negative lens can be placed relatively close to the input of the final pass of the amplifier. The negative lens can be a cylindrical or spherical lens. Also, the beam divergence can be increased as the beam enters the final pass in the amplifier. This can prevent the output window of the amplifier from being exposed to a high power density beam. Additionally, this can help to compensate for effects of thermal lensing in the amplifier. A negative lens (spherical or cylindrical) can be used, or a telescope that is adjusted to a total negative optical power and can combine a function of a spatial filter at the same time.

Figure 8:
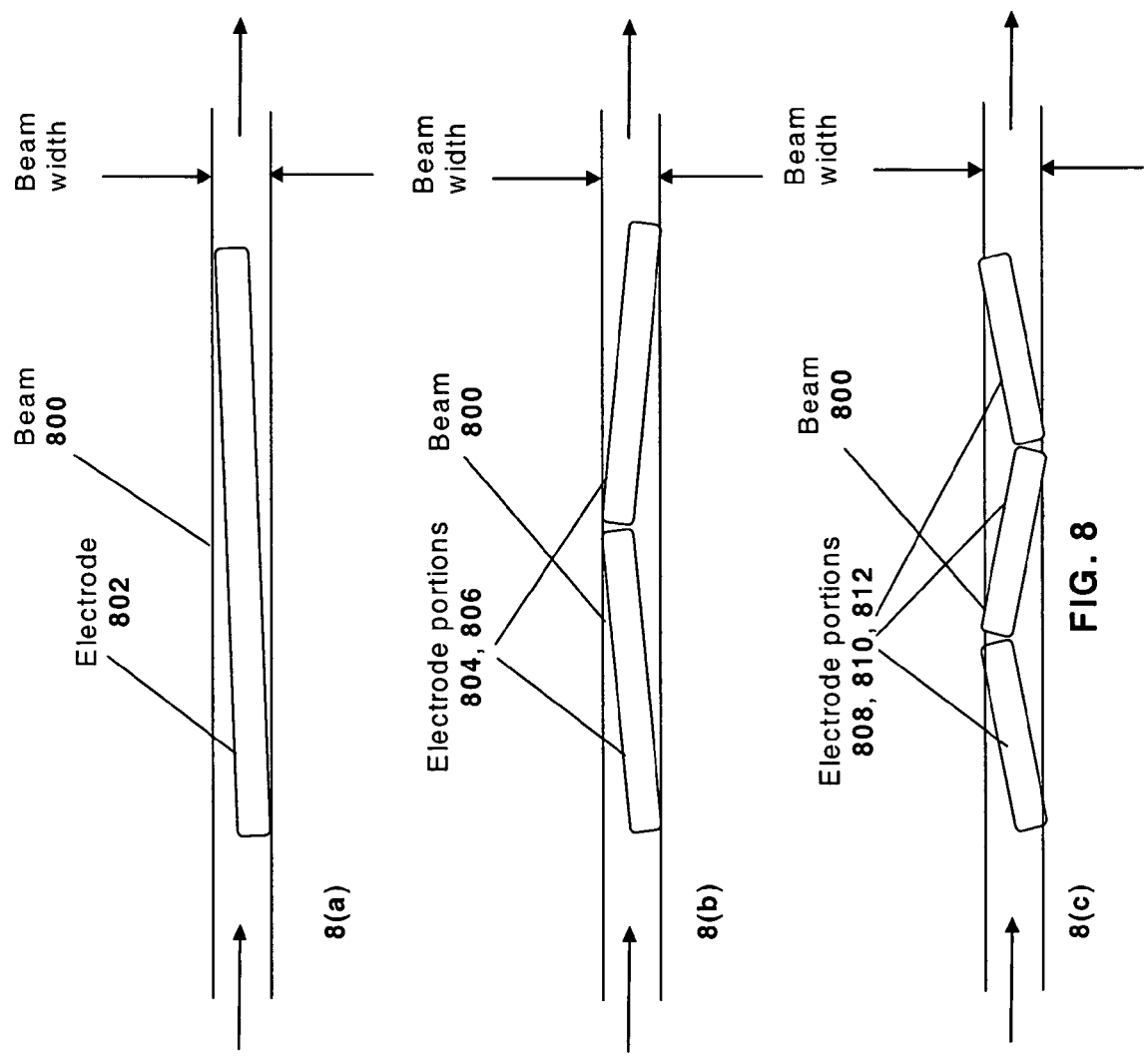
FIGS. 8(a)–8(c) show various beam expanding approaches that can be used in accordance with various embodiments of the present invention.

In order to mitigate the fast degradation of the output window of the amplifier discharge chamber, the cross-sectional area of the amplified beam can be increased in order to reduce the intensity at the window position. In order to increase the cross-sectional area, the beam can be expanded before entering the amplifier, using any of a number of beam expanding optics or approaches described herein or known or used in the art. A beam 800 also can be aligned at a small angle relative to the electrodes 802 of the amplification chamber, such as is illustrated in FIG. 8(*a*), using any of a number of beam directing optics. The beam width thus becomes equal to $D=d+\alpha L$, where D and d are beam width and electrode width respectively, $\alpha$ is the tilt angle, and L is the electrode length. One downside of such a solution is a potential reduction of the overall gain. However, such reduction may be acceptable given the benefit of increased optic lifetime.

Another potential downside to the angled beam approach of FIG. 8(*a*) is that the beam path typically will require adjustment to obtain the proper small angle relative to the electrode, which can increase the difficulty of optical alignment. Another approach does not angle the beam relative to a chamber electrode, but rather splits the electrode into portions each of which can be angled with respect to the beam. For instance, the electrode portions can be angled with respect to each other but within the beam path so as to form a V-shape, as shown with the electrode portions 804, 806 in FIG. 8(*b*), or a zigzag pattern, such as shown with the electrode portions 808, 810, 812 in FIG. 8(*c*). While the main operating principle is similar, the optical alignment is simplified since the beam path becomes symmetrical with respect to the chamber.

Figure 9:
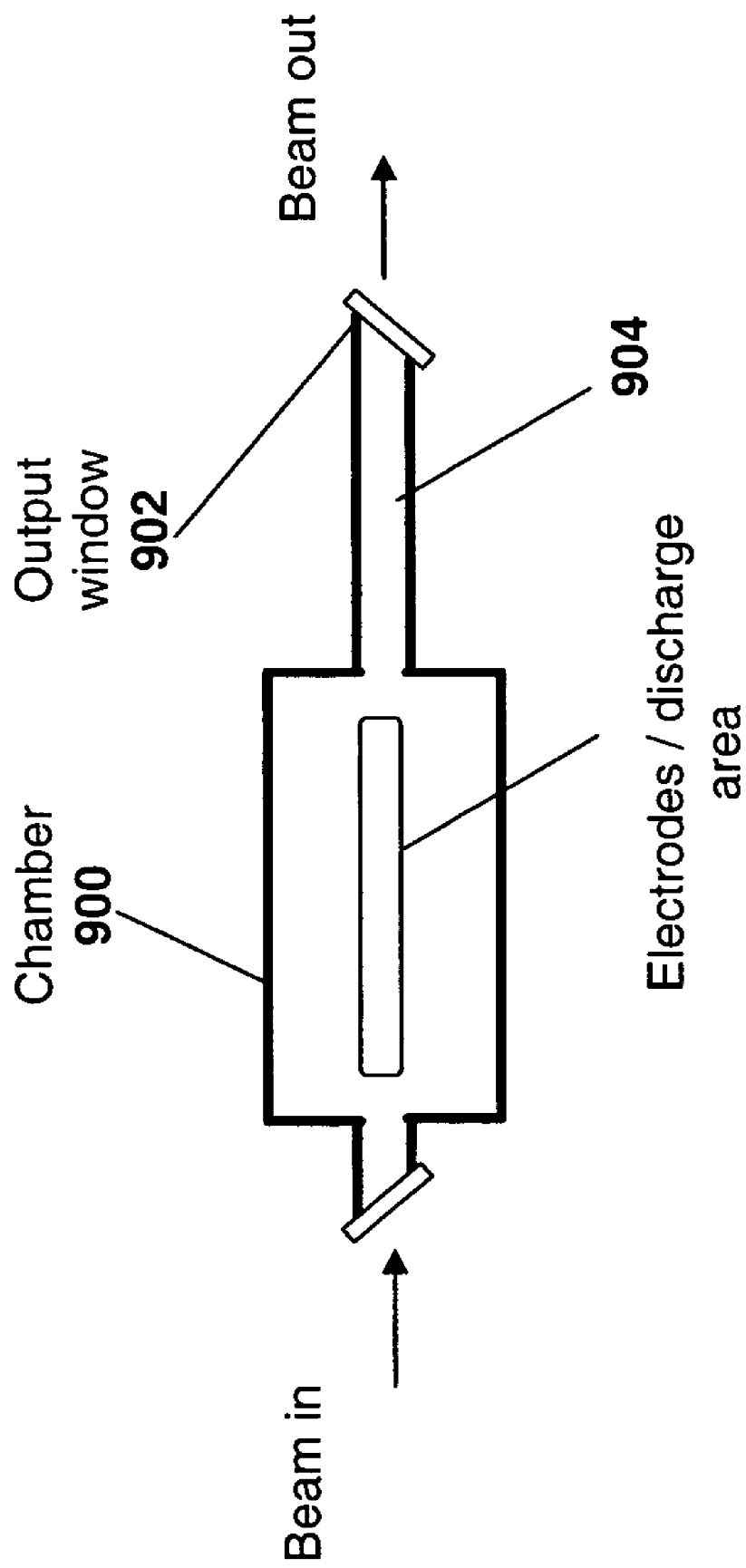
FIG. 9 shows an extended output window position that can be used in accordance with various embodiments of the present invention.

Another approach that can be used to further mitigate degradation of the amplifier output window 902 involves moving the output window away from the discharge area in the amplifier chamber 900, such as is shown in FIG. 9. Increasing the distance can reduce the likelihood of contamination by dust particles generated in the discharge that can otherwise accelerate window decay. Contamination of the window can lead to absorption of the beam at the surface and, thus, generation of heat and failure of the window due to fracture. The output window can be attached to an extender 904, for example, which not only seals the amplifier chamber but also can provide for an increased offset of the window from the discharge area. Optical pulse extenders have been developed in order to extend the output pulse after leaving the laser system, as described in U.S. Pat. No. 6,389,045 B1 incorporated herein by reference. The use of such an extender may only be useful for the amplifier chamber, however, as it is standard to minimize the total length of the optical resonator for the oscillator chamber, while the total length is not critical in the amplifier.

Laser System Components

Figure 10:
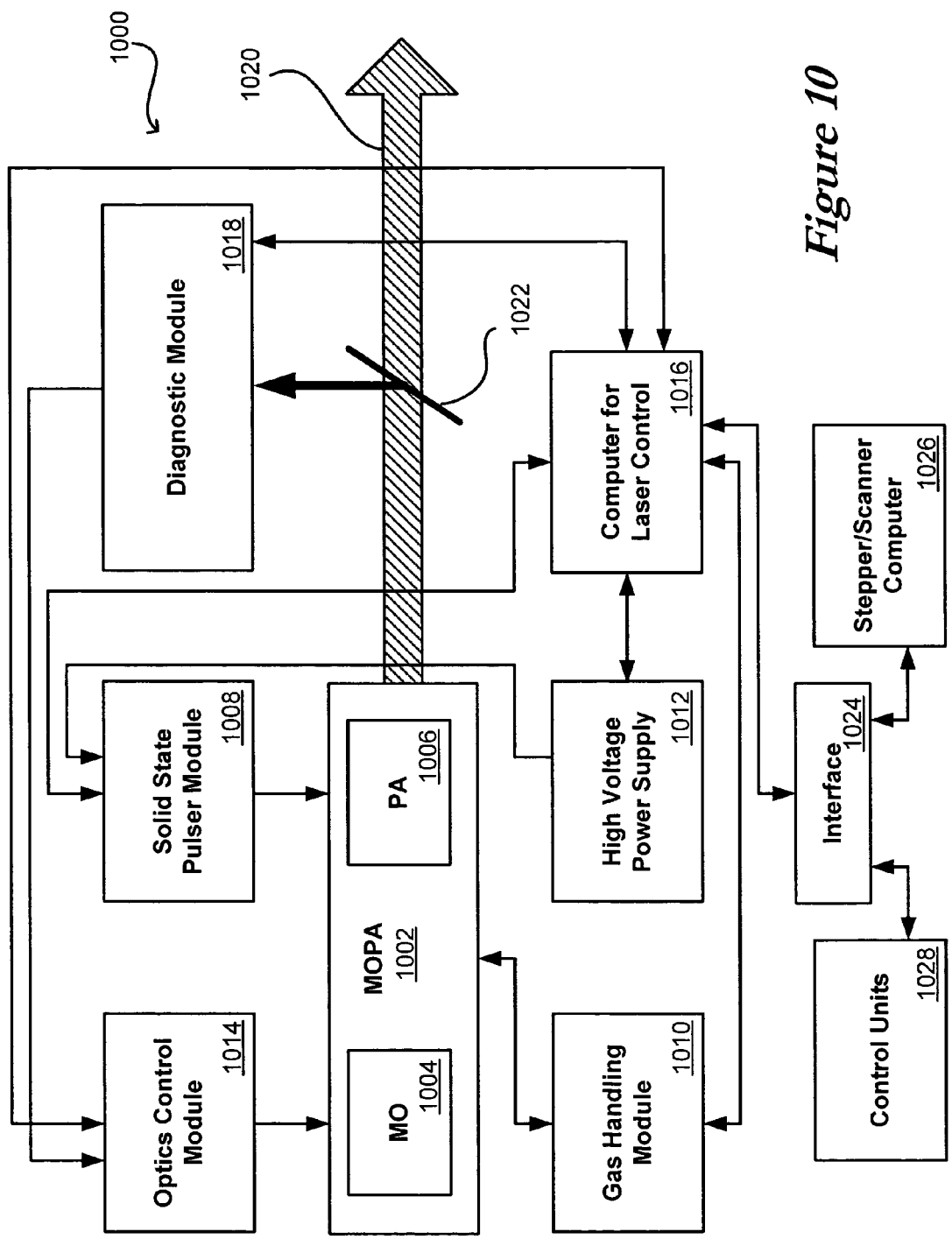
FIG. 10 shows an overall laser system showing components that can be used with a system in accordance with various embodiments of the present invention.

FIG. 10 schematically illustrates an exemplary MOPA excimer or molecular fluorine laser system 1000, which contains various components that can be used in accordance with embodiments of the present invention as would be understood to one of ordinary skill in the art. The gas discharge laser system can be a deep ultraviolet (DUV) or vacuum ultraviolet (VUV) laser system, such as an excimer laser system, e.g., ArF, XeCl or KrF, or a molecular fluorine ($F_2$) laser system for use with a DUV or VUV lithography system. Alternative configurations for laser systems, for use in such other industrial applications as TFT annealing, photoablation and/or micromachining, e.g., include configurations understood by those skilled in the art as being similar to, and/or modified from, the system shown in FIG. 10 to meet the requirements of that application.

The laser system 1000 includes a MOPA laser component 1002 as described herein, which includes a master oscillator chamber 1004 and a power amplifier chamber 1006. Each chamber can have an associated heat exchanger and/or fan for circulating a gas mixture within the chamber. Each chamber can include a plurality of electrodes, such as a pair of main discharge electrodes and one or more ionization electrodes or elements, which can be connected with a solid-state pulser module 1008, or with separate pulser modules or circuitry as described elsewhere herein. At least one gas handling module 1010 can have a valve connection to each chamber, such that halogen, rare and buffer gases, and gas additives, can be injected or filled into the chambers, such as in premixed forms for ArF, XeCl and KrF excimer lasers, as well as halogen, buffer gases, and any gas additive for an $F_2$ laser. The gas handling module(s) 1010 can be preferred when the laser system is used for microlithography applications, wherein very high energy stability is desired. Gas handling modules can be optional for a laser system such as a high power XeCl laser. A solid-state pulser module 1008 can be powered by a high voltage power supply 1012. Alternatively, a thyratron pulser module can be used. The oscillator chamber 1004 can be surrounded by optics modules, forming a resonator. The optics modules can include a highly reflective resonator reflector in a rear optics module, and a partially reflecting output coupling mirror in a front optics module. The optics modules can be controlled by an optics control module 1014, or can be directly controlled by a computer or processor 1016, particularly when line-narrowing optics are included in one or both of the optics modules.

The processor 1016 for laser control can receive various inputs and control various operating parameters of the system. A diagnostic module 1018 can receive and measure one or more parameters of a split off portion of the main beam 1020 via optics for deflecting a small portion of the beam toward the module 1018. The diagnostic module can also receive a portion of the beam between the MO and the PA (not shown) in order to measure one or more parameters of the pulse before amplification by the PA. These parameters can include pulse energy, average energy and/or power, and wavelength. The optics for deflecting a small portion of the beam can include a beam splitter module 1022. The beam 1020 exiting the MOPA can be laser output to an imaging system (not shown) and ultimately to a workpiece (also not shown), such as for lithographic applications, and can be output directly to an application process. Laser control computer 1016 can communicate through an interface 1024 with a stepper/scanner computer 1026, other control units 1028, and/or other, external systems.

The processor or control computer 1016 can receive and process parameter values, such as may include the pulse shape, energy, ASE, energy stability, energy overshoot (for burst mode operation), wavelength, spectral purity, and/or bandwidth, as well as other input or output parameters of the laser system and/or output beam. The processor can receive signals corresponding to the wavefront compensation, such as values of the bandwidth, and can control wavefront compensation, performed by a wavefront compensation optic in a feedback loop, by sending signals to adjust the pressure(s) and/or curvature(s) of surfaces associated with the wavefront compensation optic. The processor 1016 also can control the line narrowing module to tune the wavelength, bandwidth, and/or spectral purity, and can control the power supply 1012 and pulser module 1008 to control the moving average pulse power or energy, such that the energy dose at points on a workpiece is stabilized around a desired value. The laser control computer 1016 also can control the gas handling module 1010, which can include gas supply valves connected to various gas sources.

Each laser chamber can contain a laser gas mixture, and can include one or more ionization electrodes in addition to the pair of main discharge electrodes. The main electrodes can be similar to those described at U.S. Pat. No. 6,466,599 B1 (incorporated herein by reference above) for photolithographic applications.

The solid-state or thyratron pulser module 1008 and high voltage power supply 1012 can supply electrical energy in compressed electrical pulses to ionization and/or main electrodes within each laser chamber, in order to energize the gas mixture. A rear optics module can include line-narrowing optics for a line narrowed excimer or molecular fluorine laser as described above, which can be replaced by a high reflectivity mirror or the like in a laser system wherein either line-narrowing is not desired, or if line narrowing is performed at the front optics module, or a spectral filter external to the resonator is used, or if the line-narrowing optics are disposed in front of the HR mirror, for narrowing the bandwidth of the output beam.

Each laser chamber can be sealed by windows transparent to the wavelengths of the emitted laser radiation 1020. The windows can be Brewster windows, or can be aligned at an angle, such as on the order of about 5°, to the optical path of the resonating beam. One of the windows also can serve to output couple the beam.

After a portion of the output beam 1020 passes from the MOPA component 1002, that output portion can impinge upon a beam splitter module 1022 including optics for deflecting a portion of the beam to a diagnostic module 1018, or otherwise allowing a small portion of the output beam to reach the diagnostic module 1018, while a main beam portion is allowed to continue as the output beam 1020 of the laser system. The optics can include a beamsplitter or otherwise partially reflecting first surface optic, as well as a mirror or beam splitter as a second reflecting optic. More than one beam splitter and/or HR mirror(s), and/or dichroic mirror(s) can be used to direct portions of the beam to components of the diagnostic module 1018. A holographic beam sampler, transmission grating, partially transmissive reflection diffraction grating, grism, prism or other refractive, dispersive and/or transmissive optic or optics also can be used to separate a small beam portion from the main beam 1020 for detection at the diagnostic module 1018, while allowing most of the main beam 1020 to reach an application process directly, via an imaging system or otherwise.

The output beam 1020 can be transmitted at the beam splitter module, while a reflected beam portion is directed at the diagnostic module 1018. Alternatively, the main beam 1020 can be reflected while a small portion is transmitted to a diagnostic module 1018. The portion of the outcoupled beam which continues past the beam splitter module can be the output beam 1020 of the laser, which can propagate toward an industrial or experimental application such as an imaging system and workpiece for photolithographic applications.

For a system such as a molecular fluorine laser system or ArF laser system, an enclosure (not shown) can be used to seal the beam path of the beam 1020 in order to keep the beam path free of photoabsorbing species. Smaller enclosures can seal the beam path between each chamber, between the chambers and any optics modules, as well as between the beam splitter 1022 and the diagnostic module 1018.

The diagnostic module 1018 can include at least one energy detector to measure the total energy of the beam portion that corresponds directly to the energy of the output beam 1020. An optical configuration such as an optical attenuator, plate, coating, or other optic can be formed on or near the detector or beam splitter module 1022, in order to control the intensity, spectral distribution, and/or other parameters of the radiation impinging upon the detector.

A wavelength and/or bandwidth detection component can be used with the diagnostic module 1018, the component including, for example, a monitor etalon or grating spectrometer. Other components of the diagnostic module can include a pulse shape detector or ASE detector, such as for gas control and/or output beam energy stabilization, or to monitor the amount of amplified spontaneous emission (ASE) within the beam, ensuring that the ASE remains below a predetermined level. There also can be a beam alignment monitor and/or beam profile monitor.

The processor or control computer 1016 can receive and process values for the pulse shape, energy, ASE, energy stability, energy overshoot for burst mode operation, wavelength, and spectral purity and/or bandwidth, as well as other input or output parameters of the MOPA system and output beam. The processor 1016 also can control the line narrowing module to tune the wavelength and/or bandwidth or spectral purity, and can control each power supply 1012 and pulser module 1008 to control the moving average pulse power or energy, such that the energy dose at points on the workpiece can be stabilized around a desired value. In addition, the computer 1016 can control each gas handling module 1010, which can include gas supply valves connected to various gas sources. Further functions of the processor 1016 can include providing overshoot control, stabilizing the energy, and/or monitoring energy input to the discharge.

The processor 1016 can communicate with each solid-state or thyratron pulser module 1008 and HV power supply 1012, separately or in combination, as well as the gas handling module 1010, the optics modules, the diagnostic module 1018, and an interface 1024. The processor 1016 also can control an auxiliary volume, which can be connected to a vacuum pump (not shown) for releasing gases from each laser chamber and for reducing a total pressure in the tube. The pressure in the tube can also be controlled by controlling the gas flow through the ports to and from the additional volume.

A laser gas mixture initially can be filled into each laser chamber in a process referred to herein as a "new fill". In such procedure, a laser tube can be evacuated of laser gases and contaminants, and re-filled with an ideal gas composition of fresh gas. The gas composition for a very stable excimer or molecular fluorine laser can use helium or neon, or a mixture of helium and neon, as buffer gas(es), depending on the laser being used. The gas composition can vary between the MO and the PA, as described in U.S. patent application Ser. No. 09/923,770, filed Aug. 6, 2001, incorporated herein by reference above.

Total pressure adjustments in the form of releases of gases or reduction of the total pressure within each chamber also can be performed. Total pressure adjustments can be followed by gas composition adjustments if necessary. Total pressure adjustments also can be performed after gas replenishment actions, and can be performed in combination with smaller adjustments of the driving voltage to the discharge than would be made if no pressure adjustments were performed in combination.

Line-narrowing features in accordance with various embodiments of a laser system can be used along with the wavefront compensating optic. For an $F_2$ laser, for example, the optics can be used for selecting the primary line $\lambda_1$ from multiple lines around 157 nm. The optics can be used to provide additional line narrowing and/or to perform line-selection. The resonator can include optics for line-selection, as well as optics for line-narrowing of the selected line. Line-narrowing can be provided by controlling (i.e., reducing) the total pressure.

Exemplary line-narrowing optics contained in the optics modules and/or between chambers can include at least one beam expanding element. An optional interferometric device such as an etalon and a diffraction grating also can be used, which can produce a relatively high degree of dispersion. A beam expander can include one or more prisms, as well as other beam expanding optics, such as a lens assembly or a converging/diverging lens pair.

The material used for any dispersive prisms, beam expander prisms, etalons, or other interferometric devices, laser windows, and/or the outcoupler can be a material that is highly transparent at excimer or molecular fluorine laser wavelengths, such as 248 nm for the KrF laser, 193 nm for the ArF laser and 157 nm for the $F_2$ laser. The material can be capable of withstanding long-term exposure to ultraviolet light with minimal degradation effects. Examples of such materials can include $CaF_2$, $MgF_2$, BaF2, LiF, and $SrF_2$. In some cases fluorine-doped quartz can be used, while fused silica can be used for the KrF laser. Many optical surfaces, particularly those of the prisms, can have an anti-reflective coating, such as on one or more optical surfaces of an optic, in order to minimize reflection losses and prolong optic lifetime.

It should be recognized that a number of variations of the above-identified embodiments will be obvious to one of ordinary skill in the art in view of the foregoing description. Accordingly, the invention is not to be limited by those specific embodiments and methods of the present invention shown and described herein. Rather, the scope of the invention is to be defined by the following claims and their equivalents.

What is claimed is:

1. An excimer or molecular fluorine laser system, comprising:
    a master oscillator including therein a first discharge chamber filled with a first gas mixture, the first discharge chamber containing a pair of electrodes for energizing the gas mixture and generating an optical pulse;

a power amplifier including therein a second discharge chamber filled with a second gas mixture, the second discharge chamber containing a pair of electrodes for energizing the gas mixture and amplifying the optical pulse as the optical pulse generated by the master oscillator passes through the power amplifier; and a pulse extender module including a beamsplitting prism for receiving the amplified optical pulse, the beamsplitting prism having a planar first surface capable of reflecting a portion of the amplified optical pulse along an output path and transmitting a portion of the amplified optical pulse through the beamsplitting prism, the transmitted portion passing through a second surface of the beamsplitting prism that is angled with respect to the first surface such that a width of the transmitted portion is increased upon transmission, the transmitted pulse being directed through a delay line and being incident upon a third surface of the prism upon exiting the delay line, the third surface being angled with respect to the first surface such that the transmitted portion is passed as an output portion directed along the output path.

2. A laser system according to claim 1, wherein:
the transmitted portion passed as an output portion is compressed by the beamsplitting prism to have a width approximately equal to a width of the amplified optical pulse.

3. A laser system according to claim 1, wherein:
the equilateral prism compresses the transmitted beam portion when the transmitted portion passes through the third surface at an angle approximately equal to the angle at which the transmitted portion exits the second surface, such that the width of the transmitted beam exiting the first surface is approximately equal to the width of the incident beam.

4. A laser system according to claim 1, wherein:
the first surface of the equilateral prism is oriented with respect to the incident beam at an angle whereby about 20% to about 35% of the beam is reflected by the first surface as a reflected portion.

5. A laser system according to claim 1, wherein:
the first surface of the equilateral prism is oriented with respect to the incident beam at an angle between about 80° and 83° from a normal to the first surface.

6. A laser system according to claim 1, wherein:
the second and third surfaces form an apex angle therebetween.

7. A laser system according to claim 6, wherein:
the apex angle and orientation of the equilateral prism are selected such that the transmitted portion intersects the second surface at approximately the Brewster angle, whereby the transmitted portion experiences little loss due to reflection from the second surface.

8. A laser system according to claim 6, wherein:
the apex angle and orientation of the prism are selected such that a subsequent portion of the transmitted beam portion is reflected by the first surface and exits the second surface along a transmitted beam path of the transmitted beam portion.

9. A laser system according to claim 6, wherein:
the apex angle is selected to minimize losses due to reflectance of the transmitted portion at the second surface.

10. A laser system according to claim 6, wherein:
the apex angle is in the range of from about 90° to about 165°.

11. A laser system according to claim 6, wherein:
the apex angle is in the range of from about 90° to about 180°.

12. A laser system according to claim 6, wherein:
the apex angle is in the range of from about 155° to about 175°.

13. A laser system according to claim 6, wherein:
the pulse extender module includes at least two mirror elements forming the delay line.

14. A laser system according to claim 1, wherein:
the beamsplitting prism is further capable of reflecting part of the transmitted portion back through the delay line.

15. A laser system according to claim 1, wherein:
the pulse extender module results in a series of output pulses having a peak separation defined by the length of the delay line, each of the output pulses having less energy than the amplified optical pulse.

16. A laser system according to claim 15, wherein:
a first output pulse and a second output pulse in the series of output pulses have approximately equal energy.

17. A laser system according to claim 1, wherein:
the beamsplitting prism is composed of $CaF_2$.

18. A laser system according to claim 1, wherein:
the beamsplitting prism is oriented such that the optical pulse is incident on a surface of the prism and at an angle of approximately 81.6° relative to a normal of the surface.

19. A laser system according to claim 6, wherein:
the apex angle is selected to obtain a desired width expansion of the transmitted portion.

20. A laser system according to claim 19, wherein:
the transmitted portion is expanded by a factor of about 3.44, whereby the intensity of the optical pulse portion on the optical elements of the delay line is reduced.

21. A laser system according to claim 19, wherein:
the expanded transmitted portion is compressed upon subsequent transmission through the beamsplitting prism.

22. A laser system according to claim 1, further comprising:
a set of reflective optics capable of redirecting at least a portion of the optical pulse back through the power amplifier.

23. A laser system according to claim 22, wherein:
the set of reflective optics redirects the portion of the optical pulse back through the power amplifier for a subsequent pass an angle relative to the direction of the previous pass.

24. A laser system according to claim 1, further comprising:
at least one optical decoupler positioned along a path of the optical pulse and capable of at least one of reducing energy fluctuations and suppressing spontaneous emissions.

25. A laser system according to claim 1, further comprising:
a line-narrowing optics module for narrowing the optical pulse.

26. A laser system according to claim 1, further comprising:
a spatial filter positioned along a path of the optical pulse and capable of at least one of optically decoupling the pulse and modifying a width of the pulse.

27. A method of generating a stretched output beam in an excimer or molecular fluorine laser system, comprising:
generating an optical pulse in a master oscillator;

passing the optical pulse through a power amplifier, whereby the optical pulse is amplified; and directing at least a portion of the amplified optical pulse through a pulse extender module including a delay line and a beamsplitting prism, the beamsplitting prism having a planar first surface oriented with respect to the optical pulse such that a portion of the amplified optical pulse is reflected along an output path and a portion of the amplified optical pulse is transmitted through the beamsplitting prism, the transmitted portion passing through a second surface of the beamsplitting prism that is angled with respect to the first surface such that a width of the transmitted portion is increased upon transmission, the transmitted pulse being directed through a delay line and being incident upon a third surface of the prism upon exiting the delay line, the third surface being angled with respect to the first surface such that the transmitted portion passes as an output portion directed along the output path.

28. A method according to claim 27, further comprising:
reflecting a portion of the transmitted portion back through the delay line.

29. A method according to claim 27, wherein:
the beamsplitting prism and delay line produce a series of output pulses having a peak separation defined by the length of the delay line, each of the output pulses having less energy than the amplified optical pulse.

30. A method according to claim 27, further comprising:
selecting an apex angle between the second and third surfaces in order to obtain a desired expansion of the transmitted pulse in the delay line.

31. A method according to claim 27, further comprising:
orienting the prism with respect to the amplified optical pulse such that about 20% to about 35% of the beam is reflected by the first surface.

32. A method according to claim 27, further comprising:
orienting the first surface of the prism at an angle of between about 7° and about 10° with respect to the amplified optical pulse.

33. An excimer or molecular fluorine laser system, comprising:
a master oscillator including therein a first discharge chamber filled with a first gas mixture, the first discharge chamber containing a pair of electrodes for energizing the gas mixture and generating an optical pulse;
a power amplifier including therein a second discharge chamber filled with a second gas mixture, the second discharge chamber containing a pair of electrodes for energizing the gas mixture and amplifying the optical pulse as the optical pulse generated by the master oscillator passes through the power amplifier;
a housing enclosing the master oscillator and the power amplifier, the housing having an output window for transmitting the amplified optical pulse as an output beam;
a set of reflective optics in the housing for directing the amplified optical pulse through a substantially horizontal side of the housing before transmission of the optical pulse through the output window; and
a pulse extender module positioned substantially parallel to the horizontal side, the pulse extender module including at least one beamsplitting element capable of reflecting a portion of the amplified optical pulse and transmitting a portion of the amplified optical pulse through a substantially horizontal delay line of the pulse extender module, the pulse extender module further including at least one optical element capable of further directing the reflected and transmitted portions to the set of reflective optics for transmission through the output window as an output beam.

34. A laser system according to claim 33, wherein:
the pulse extender module stretches the optical pulse by a factor about 3 to about 10.

35. A laser system according to claim 33, wherein:
the optical elements of the pulse extender module include at least two mirrors and at least one beamsplitting prism forming the delay line.

36. A laser system according to claim 35, wherein:
the prism is a beamsplitting prism having a planar first surface and an angled second surface such that a portion of an optical pulse incident upon the prism is reflected and a portion is transmitted through the prism, the transmitted portion being expanded upon exiting the beamsplitter with minimal loss due to reflectance.

37. A laser system according to claim 33, wherein:
the pulse extender module results in a series of output pulses having a peak separation defined by the length of the delay line, each of the output pulses having less energy than the amplified optical pulse.

38. A laser system according to claim 37, wherein:
a first output pulse and a second output pulse in the series of output pulses have approximately equal energy.

39. A laser system according to claim 24, wherein:
the optical pulse is expanded during the delay line, whereby the intensity of the optical pulse on the optical elements of the delay line is reduced.

40. A laser system according to claim 33, further comprising:
a set of reflective optics capable of redirecting at least a portion of the optical pulse back through the power amplifier.

41. A laser system according to claim 40, wherein:
the set of reflective optics redirects the portion of the optical pulse back through the power amplifier for a subsequent pass an angle relative to the direction of a previous pass.

42. A laser system according to claim 33, further comprising:
at least one optical decoupler positioned along a path of the optical pulse and capable of at least one of reducing energy fluctuations and suppressing spontaneous emissions.

43. A laser system according to claim 33, further comprising:
a line-narrowing optics module for narrowing the optical pulse.

44. A laser system according to claim 33, further comprising:
a spatial filter positioned along a path of the optical pulse and capable of at least one of optically decoupling the pulse and modifying a width of the pulse.

45. A method of generating a stretched output pulse in an excimer or molecular fluorine laser system, comprising:
generating an optical pulse in a master oscillator;
passing the optical pulse through a power amplifier, whereby the optical pulse is amplified;
directing at least a portion of the amplified optical pulse through an opening in a substantially horizontal side of a laser housing containing the master oscillator and power amplifier before transmission of the optical pulse through an output window of the housing; and passing the directed portion through a pulse extender module positioned substantially parallel to the substantially horizontal side of the housing, the pulse extender module passing the directed portion of the amplified optical pulse through a substantially horizontal delay line and back to the set of reflective optics whereby the directed portion is transmitted through the output window as an output pulse.

46. A method according to claim 45, further comprising:
stretching the optical pulse by a factor on the order of about 3 to about 10 using the pulse extender module.

47. A method according to claim 45, further comprising:
forming the delay line of the pulse extender module using at least two mirrors and at least one prism.

48. A method according to claim 47, wherein:
the prism is a beamsplitting prism having a planar first surface and an angled second surface such that a portion of an optical pulse incident upon the prism is reflected and a portion is transmitted through the prism, the transmitted portion being expanded upon exiting the beamsplitter.

49. A method according to claim 45, further comprising:
configuring the pulse extender module whereby the amplified optical pulse results in a series of output pulses spaced apart by a time interval defined by the length of the delay line, each of the output pulses having less energy than the amplified optical pulse.

50. A method according to claim 45, further comprising:
expanding the optical pulse during the delay line, whereby the intensity of the optical pulse on the optical elements of the delay line is reduced.

51. A method according to claim 45, further comprising:
redirecting at least a portion of the optical pulse back through the power amplifier.

52. A method according to claim 45, further comprising:
positioning a spatial filter along a path of the optical pulse, the spatial filter capable of at least one of optically decoupling the pulse and modifying a width of the pulse.

* * * * *